US006993823B2

(12) United States Patent
Kobayashi et al.

(10) Patent No.: US 6,993,823 B2
(45) Date of Patent: Feb. 7, 2006

(54) METHOD OF MANUFACTURING OXIDE SUPERCONDUCTING WIRE

(75) Inventors: Shin-ichi Kobayashi, Osaka (JP); Takeshi Kato, Osaka (JP)

(73) Assignee: Sumitomo Electric Industries, Ltd., Osaka (JP)

( * ) Notice: Subject to any disclaimer, the term of this patent is extended or adjusted under 35 U.S.C. 154(b) by 0 days.

(21) Appl. No.: 10/487,354

(22) PCT Filed: May 22, 2003

(86) PCT No.: PCT/JP03/06429

§ 371 (c)(1),
(2), (4) Date: Feb. 20, 2004

(87) PCT Pub. No.: WO03/100795

PCT Pub. Date: Dec. 4, 2003

(65) Prior Publication Data
US 2004/0237294 A1 Dec. 2, 2004

(30) Foreign Application Priority Data
May 24, 2002 (JP) .............................. 2002-150963
Nov. 8, 2002 (JP) .............................. 2002-325243
Mar. 3, 2003 (JP) ....................... PCT/JP03/02449

(51) Int. Cl.
H01L 39/24 (2006.01)

(52) U.S. Cl. .......................... 29/599; 29/825; 505/430; 505/432; 505/500; 505/501

(58) Field of Classification Search .................. 29/599, 29/825; 505/500, 501, 430, 432, 433
See application file for complete search history.

(56) References Cited

U.S. PATENT DOCUMENTS

| 4,952,554 | A | * | 8/1990 | Jin et al. ..................... 505/230 |
| 5,236,891 | A | * | 8/1993 | Hikata et al. ............... 505/433 |
| 5,306,698 | A | * | 4/1994 | Ahn et al. ................... 505/475 |
| 5,550,103 | A | * | 8/1996 | Motowidlo et al. ......... 505/430 |

(Continued)

FOREIGN PATENT DOCUMENTS

| EP | 0 404 966 A1 | 1/1991 |
| EP | 1 172 868 A2 * | 1/2002 |

(Continued)

Primary Examiner—Carl J. Arbes
(74) Attorney, Agent, or Firm—Foley & Lardner LLP

(57) ABSTRACT

The inventive method of manufacturing an oxide superconducting wire comprises a step (S1, S2) of preparing a wire formed by covering raw material powder of an oxide superconductor with a metal and a step (S4, S6) of heat-treating the wire in a pressurized atmosphere, and the total pressure of the pressurized atmosphere is at least 1 MPa and less than 50 MPa. Thus, formation of voids between oxide superconducting crystals and blisters of the oxide superconducting wire is suppressed while the partial oxygen pressure can be readily controlled in the heat treatment, whereby the critical current density can be improved.

21 Claims, 13 Drawing Sheets

U.S. PATENT DOCUMENTS

| | | | |
|---|---|---|---|
| 5,635,456 A * | 6/1997 | Riley et al. | 505/501 |
| 5,661,114 A * | 8/1997 | Otto et al. | 505/501 |
| 5,705,457 A * | 1/1998 | Tamura et al. | 505/482 |
| 5,942,466 A * | 8/1999 | Li et al. | 505/431 |
| 6,202,287 B1 * | 3/2001 | Otto | 29/599 |
| 6,311,386 B1 * | 11/2001 | Li et al. | 29/599 |
| 6,436,876 B1 * | 8/2002 | Otto et al. | 505/501 |
| 6,555,503 B1 | 4/2003 | Li et al. | |
| 6,632,776 B2 * | 10/2003 | Kobayashi et al. | 505/470 |
| 6,713,437 B2 * | 3/2004 | Kobayashi et al. | 505/500 |

FOREIGN PATENT DOCUMENTS

| | | |
|---|---|---|
| EP | 1 179 868 A2 * | 1/2002 |
| JP | 63-285812 A | 11/1988 |
| JP | 64-030114 | 2/1989 |
| JP | 3-45301 A | 2/1991 |
| JP | 3-153559 A | 7/1991 |
| JP | 5-101723 A | 4/1993 |
| JP | 7-232960 A | 9/1995 |
| JP | 2592846 B2 | 12/1996 |
| WO | 91/00622 * | 1/1991 |

* cited by examiner

FIG.3
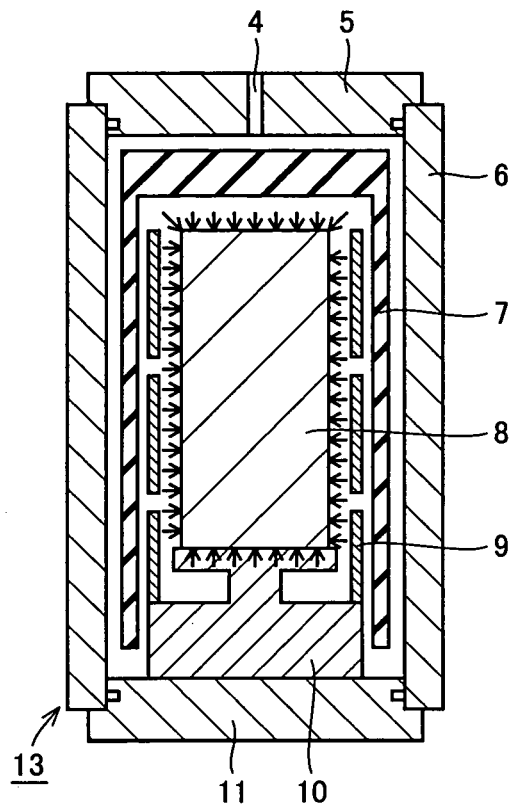
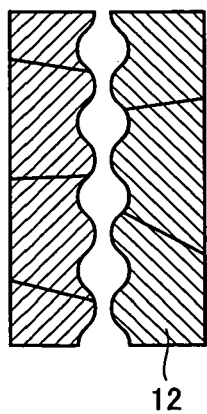
FIG.4A
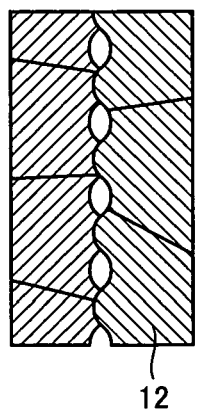
FIG.4B
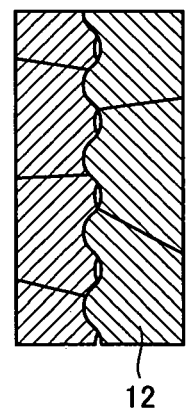
FIG.4C
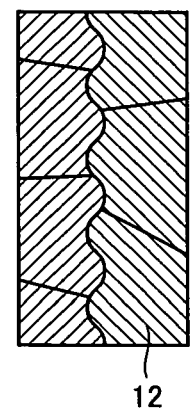
FIG.4D

PERFORMING HEAT TREATMENT UNDER PRESSURIZED ATMOSPHERE ACCORDING TO INVENTION

PERFORMING HEAT TREATMENT IN ATMOSPHERIC PRESSURE ACCORDING TO PRIOR ART

METHOD OF MANUFACTURING OXIDE SUPERCONDUCTING WIRE

TECHNICAL FIELD

The present invention relates to a method of manufacturing an oxide superconducting wire, and more particularly, it relates to a method of manufacturing an oxide superconducting wire from a wire formed by covering raw material powder of an oxide superconductor with a metal.

BACKGROUND TECHNIQUE

In general, a method of obtaining an oxide superconducting wire by heat-treating a wire formed by charging a metal tube with raw material powder of an oxide superconductor and thereafter wiredrawing and rolling the metal tube for sintering the raw material powder of the oxide superconductor is known as a method of manufacturing an oxide superconducting wire. However, the wire is blistered in the aforementioned heat treatment step for sintering, to disadvantageously reduce the superconductivity of the obtained oxide superconducting wire.

Japanese Patent Laying-Open No. 5-101723 proposes a method of manufacturing an oxide superconducting wire by heat-treating a metal tube charged with powder of an oxide superconductor or a flattened body thereof for sintering the powder of the oxide superconductor. The aforementioned gazette describes that a wire having excellent superconductivity is obtained according to this method by performing a pressure heat treatment.

More specifically, it is attempted to store a metal tube charged with powder of an oxide superconductor in a heat-resistant/pressure-resistant closed vessel for preventing blistering in sintering by increasing the internal pressure following temperature rise in the closed vessel. The aforementioned gazette describes that the current internal pressure can be obtained from a state equation of gas or the like, and an internal pressure of about 4 atm. can be obtained with a heating temperature of about 900° C., for example.

Japanese Patent No. 2592846 (Japanese Patent Laying-Open No. 1-30114) proposes a method of manufacturing an oxide superconducting conductor by holding a metal tube charged with oxide superconducting powder or the like in a high-pressure state at least either in a heat treatment or after the heat treatment. The aforementioned gazette describes that partial separation on the interface between the oxide superconductor and the metal tube caused in sintering can be prevented according to this method by setting the metal tube in the high-pressure state.

More specifically, the metal tube charged with the oxide superconducting powder can be press-fitted to a sintered body by holding the metal tube in a high-pressure state of 500 to 2000 kg/cm² (about 50 to 200 MPa) at least either in the heat treatment or after the heat treatment. Thus, when the superconductor partially causes quenching, heat resulting from this quenching can be quickly removed. In addition, it is also possible to prevent deterioration of the superconductivity resulting from a separation part forming a stress concentration part causing distortion.

In Japanese Patent Laying-Open No. 5-101723, however, the internal pressure obtained following temperature rise in the closed vessel is about 4 atm (0.4 MPa). Thus, voids are formed between oxide superconducting crystals in sintering, to disadvantageously reduce the critical current density.

Further, the oxide superconducting wire cannot be sufficiently inhibited from blistering caused in sintering due to the internal pressure of about 4 atm (0.4 MPa), and hence the critical current density is also disadvantageously reduced.

In the method according to Japanese Patent No. 2592846, it is difficult to control the partial oxygen pressure in the heat treatment due to application of the excessively high pressure of 500 to 2000 kg/cm² (about 50 MPa to 200 MPa), to reduce the critical current density.

DISCLOSURE OF THE INVENTION

An object of the present invention is to provide a method of manufacturing an oxide superconducting wire capable of improving the critical current density by suppressing formation of voids between oxide superconducting crystals and blisters of the oxide superconducting wire while simplifying partial oxygen pressure control in a heat treatment.

The inventive method of manufacturing an oxide superconducting wire has the following characteristics:

A wire formed by covering raw material powder of an oxide superconductor with a metal is prepared. The wire is heat-treated in a pressurized atmosphere. The total pressure of the pressurized atmosphere is at least 1 MPa and less than 50 MPa.

According to the inventive method of manufacturing an oxide superconducting wire, plastic flow and creep deformation are caused on superconducting crystals formed in a heat treatment due to the high pressure of at least 1 MPa outside the wire, thereby reducing the number of voids between the oxide superconducting crystals. Further, gas in clearances of oxide superconducting crystal powder formed in the heat treatment or gas adhering to the oxide superconducting crystal powder formed in the heat treatment can be inhibited from expansion in the heat treatment due to the pressure from outside a metal tube, whereby formation of blisters in the oxide superconducting wire is suppressed. Consequently, the critical current density is improved.

In order to form a stable oxide superconducting phase, it is necessary to regularly control the partial oxygen pressure in a constant range regardless of the value of the total pressure in the pressurized atmosphere. When the total pressure in the pressurized atmosphere exceeds 50 MPa in this case, however, the partial oxygen pressure with respect to the total pressure is reduced. Thus, the value of the oxygen concentration in the pressurized atmosphere is so remarkably reduced that it is disadvantageously difficult to control the partial oxygen pressure due to strong influence by a measurement error or the like. According to the inventive method of manufacturing an oxide superconducting wire, the heat treatment is performed in the pressurized atmosphere of less than 50 MPa so that the partial oxygen pressure with respect to the total pressure in the pressurized atmosphere is not excessively reduced but the value of the oxygen concentration in the pressurized atmosphere remains high to some extent, whereby control of the partial oxygen pressure is simplified substantially with no influence by a measurement error or the like.

Preferably in the aforementioned method of manufacturing an oxide superconducting wire, the heat-treating step is carried out by hot isostatic pressing (HIP).

Thus, the oxide superconducting wire is so isotropically pressurized that the wire is homogeneously prevented from voids and blisters.

Preferably in the aforementioned method of manufacturing an oxide superconducting wire, the oxide superconductor is a Bi—Pb—Sr—Ca—Cu—O oxide superconductor including a Bi2223 phase containing bismuth, lead, strontium, calcium and copper in atomic ratios of (bismuth and lead):strontium:calcium:copper approximately expressed as 2:2:2:3.

Thus, formation of voids between crystals and blisters of the oxide superconducting wire is suppressed, whereby the critical current density can be improved.

Preferably in the aforementioned method of manufacturing an oxide superconducting wire, the heat-treating step is carried out in an oxygen atmosphere, and the partial oxygen pressure is at least 0.003 Pa and not more than 0.02 Pa.

Thus, the partial oxygen pressure is so kept in the range of at least 0.003 MPa and not more than 0.02 MPa that a stable oxide superconducting phase is formed and the critical current density can be improved. Hetero-phases are formed if the partial oxygen pressure exceeds 0.02 MPa, while the oxide superconducting phase is hardly formed and the critical current density is reduced if the partial oxygen pressure is less than 0.003 MPa.

Preferably in the aforementioned method of manufacturing an oxide superconducting wire, the partial oxygen pressure is controlled to increase following temperature rise in the pressurized atmosphere at a heat-up time before the heat treatment in the heat-treating step.

The value of the partial oxygen pressure optimum for forming an oxide superconducting phase increases following the temperature rise. Thus, the partial oxygen pressure reaches a proper value also at the heat-up time before the heat treatment in the heat-treating step, whereby a stable oxide superconducting phase is so formed that the critical current density can be improved.

Preferably in the aforementioned method of manufacturing an oxide superconducting wire, the total pressure in the pressurized atmosphere is controlled to be constant in the heat treatment.

In the heat treatment, the total pressure may exhibit a reduction tendency due to consumption of oxygen gas resulting from oxidation of a bearer supporting the wire in a pressure vessel, hunting in pressure control of a pressure regulator such as a dwell valve or pressure fluctuation in introduction of gas added for compensating for consumed oxygen. When abrupt decompression is thereby caused in the vessel, the pressure in the wire increases as compared with that outside the wire, to blister the wire. According to the preferred aspect of the present invention, however, the total pressure in the heat treatment is controlled to be constant, whereby the wire can be prevented from formation of blisters resulting from abrupt decompression in the heat treatment.

Preferably in the aforementioned method of manufacturing an oxide superconducting wire, the heat-treating step is carried out in an oxygen atmosphere, while the partial oxygen pressure in the heat treatment is controlled to be constant in a fluctuation range within 10%.

Thus, the partial oxygen pressure can be kept in the range of the partial oxygen pressure optimum for forming an oxide superconducting phase, whereby a stable oxide superconducting phase is so formed that the critical current density can be improved.

Preferably in the aforementioned method of manufacturing an oxide superconducting wire, gas is injected to compensate for reduction of the pressure resulting from temperature reduction at a temperature reduction time immediately after the heat treatment.

Pressure reduction follows temperature change at the temperature reduction time immediately after the heat treatment. If a heating vessel is abruptly decompressed at this time, the pressure in the wire increases as compared with that outside the wire, to blister the wire. According to the preferred aspect of the present invention, however, the gas is injected to compensate for pressure reduction resulting from temperature reduction, whereby the wire can be prevented from formation of blisters resulting from abrupt decompression at the temperature reduction time immediately after the heat treatment.

Preferably in the aforementioned method of manufacturing an oxide superconducting wire, the metal covering the raw material powder includes silver, and the decompression speed at the temperature reduction time immediately after the heat treatment is controlled to not more than 0.05 MPa/min. when the ratio (hereinafter referred to as the silver ratio) of the area of a metal portion to the area of an oxide superconductor portion in a cross section of the wire after the heat-treating step is 1.5.

Thus, the effect of preventing the wire from formation of blisters resulting from abrupt decompression is further remarkable when the silver ratio is 1.5.

Preferably in the aforementioned method of manufacturing an oxide superconducting wire, the decompression speed for the total pressure in the pressurized atmosphere is controlled to not more than 0.05 MPa/min. if the temperature in the atmosphere is at least 200° C. when the metal covering the raw material powder includes silver and the silver ratio is 1.5.

If the heating vessel is abruptly decompressed when the temperature in the atmosphere is at least 200° C., the pressure in the wire increases as compared with that outside the wire, to blister the wire. Thus, the effect of inhibiting the wire from formation of blisters resulting from abrupt decompression in the heat-treating step (before the heat treatment, in the heat treatment and after the heat treatment) is further remarkable when the silver ratio is 1.5.

Preferably in the aforementioned method of manufacturing an oxide superconducting wire, the decompression speed at the temperature reduction time immediately after the heat treatment is controlled to not more than 0.03 MPa/min. when the metal covering the raw material powder includes silver and the silver ratio is 3.0.

Thus, the effect of preventing the wire from formation of blisters resulting from abrupt decompression is further remarkable when the silver ratio is 3.0.

Preferably in the aforementioned method of manufacturing an oxide superconducting wire, the decompression speed for the total pressure in the pressurized atmosphere is controlled to not more than 0.03 MPa when the metal covering the raw material powder includes silver, the silver ratio is 3.0 and the temperature in the atmosphere is at least 200° C. in the heat-treating step.

If the heating vessel is abruptly decompressed when the temperature in the atmosphere is at least 200° C., the pressure in the wire increases as compared with that outside the wire, to blister the wire. Thus, the effect of inhibiting the wire from formation of blisters resulting from abrupt decompression in the heat-treating step (before the heat treatment, in the heat treatment and after the heat treatment) is further remarkable when the silver ratio is 3.0.

Preferably in the aforementioned method of manufacturing an oxide superconducting wire, the decompression speed for the total pressure in the pressurized atmosphere is controlled to not more than 0.05 MPa when the total pressure in the pressurized atmosphere is at least 1 MPa in the heat-treating step.

If the heating vessel is abruptly decompressed when the total pressure in the atmosphere is at least 1 MPa, the pressure in the wire increases as compared with that outside the wire, to blister the wire. Thus, the effect of inhibiting the wire from formation of blisters resulting from abrupt decompression in the heat-treating step (before the heat treatment, in the heat treatment and after the heat treatment) is further remarkable.

Preferably, the aforementioned method of manufacturing an oxide superconducting wire further comprises a step of rolling the wire with a roll after the step of preparing the wire and before the heat-treating step, and the integumentary thickness of the wire after the rolling step is at least 200 µm.

Pinholes are mainly formed to pass from outside up to oxide superconductor filaments since the surface of the wire is roughened due to friction between the wire and the roll for the rolling. When the wire is so rolled that the integumentary thickness of the oxide superconducting wire is at least 200 µm in every portion after the rolling step, however, no holes pass from outside up to the oxide superconductor filaments even if the surface of the wire is roughened by rolling, and hence no pinholes are formed. Thus, formation of voids and blisters is suppressed due to the aforementioned heat-treating step, so that the critical current density can be improved. Throughout the specification, the term "pinholes" denotes holes, having diameters of at least 100 µm, passing from outside up to oxide superconducting wire filaments. The term "wire having pinholes" denotes a wire of 4 mm by 10 mm including at least two holes having diameters of at least 100 µm.

Preferably, the aforementioned method of manufacturing an oxide superconducting wire further comprises a step of bonding silver or a silver alloy to the surface of the said wire before the step of preparing the wire and after the heat-treating step.

In order to increase the quantity of a superconducting current feedable per unit area, the silver ratio of the oxide superconducting wire is minimized. However, the integumentary thickness of a wire having a small silver ratio cannot be increased due to a small ratio of a metal portion. Particularly in a wire having an integumentary thickness of less than 200 µm after the heat-treating step, pinholes are readily formed in treatment such as rolling before the heat-treating step. In the wire having pinholes, pressurizing gas penetrates into the wire through the pinholes also when the heat-treating step is carried out in the aforementioned pressurized atmosphere. Therefore, no difference is caused between the internal and external pressures of the wire, leading to a small effect of preventing reduction of the critical current density by suppressing formation of voids and blisters by pressurization. When silver or a silver alloy is bonded to the surface of the wire after the step of preparing the wire and before the heat-treating step, therefore, pinholes are covered with the silver or the silver alloy to disappear from the surface. Therefore, the heat-treating step is carried out on the wire from which pinholes are previously removed, whereby the pressurizing gas does not penetrate into the wire through pinholes in the heat-treating step. Thus, formation of voids and blisters is suppressed in the aforementioned heat-treating step in the pressurized atmosphere, whereby the critical current density can be improved.

Preferably, the aforementioned method of manufacturing an oxide superconducting wire further comprises a step of rolling the wire with a roll after the step of preparing the wire and before the heat-treating step, and surface roughness Ry of a portion of the roll coming into contact with the wire is not more than 320 µm.

Thus, friction between the wire and the roll is so reduced that the surface of the wire is hardly roughened and the wire is obtained with no pinholes regardless of the integumentary thickness of the wire. Therefore, the pressurizing gas does not penetrate into the wire through pinholes in the heat-treating step. Thus, formation of voids and blisters is suppressed due to the aforementioned heat-treating step in the pressurized atmosphere regardless of the integumentary thickness of the wire, so that the critical current density can be improved. The term "surface roughness Ry" denotes the maximum height of irregularities defined in JIS (Japanese Industrial Standards).

Preferably in the aforementioned method of manufacturing an oxide superconducting wire, the pressure is controlled to increase stepwise following temperature rise in the atmosphere at a heat-up time before the heat treatment in the heat-treating step.

When the wire has pinholes, the pressurizing gas penetrates into the wire through the pinholes also when the heat-treating step is carried out in the pressurized atmosphere by ordinary pressurization, and hence no difference is caused between the internal and external pressures of the wire, leading to a small effect of preventing reduction of the critical current density by suppressing formation of voids and blisters by pressurization. When the pressure is controlled to increase stepwise following temperature rise in the atmosphere, however, the external pressure increases before the pressurizing gas penetrates into the wire through the pinholes. Thus, pressure difference is caused between the internal and external pressures of the wire so that formation of voids and blisters is suppressed and the critical current density can be improved regardless of whether or not the wire has pinholes before the heat-treating step.

Preferably in the aforementioned method of manufacturing an oxide superconducting wire, the total pressure of the atmosphere is controlled to increase at a speed of at least 0.05 MPa/min. in temperature rise before the heat treatment in the heat-treating step.

The inventors have found that the speed of pressurizing gas penetrating into a wire through pinholes in a step of heat-treating the wire is less than about 0.05 MPa/min. When the total pressure of the atmosphere is controlled to continuously increase at the speed of at least 0.05 MPa/min. in temperature rise before the heat treatment, therefore, it is possible to regularly continuously keep the pressure in the atmosphere higher than the pressure in the wire. Thus, compressive force can be applied to the wire in the temperature rise before the heat treatment regardless of whether or not the wire has pinholes before the heat-treating step, whereby formation of voids and blisters is suppressed. Consequently, reduction of the critical current density can be effectively suppressed due to the heat treatment in the pressurized atmosphere of at least 1 MPa and less than 50 MPa.

Preferably in the aforementioned method of manufacturing an oxide superconducting wire, the total pressure in the atmosphere is controlled to continuously increase in the heat treatment in the heat-treating step.

Thus, equalization of the pressure in the wire and that in the atmosphere can be retarded in the heat treatment, and it is possible to further continuously keep the state where the pressure in the atmosphere is higher than that in the wire. Therefore, formation of voids and blisters is suppressed in the heat treatment, and reduction of the critical current density can be effectively suppressed due to the heat treatment in the pressurized atmosphere of at least 1 MPa and less than 50 MPa.

Preferably, the aforementioned method of manufacturing an oxide superconducting wire further comprises a step of rolling the wire after the step of preparing the wire and before the heat-treating step, and the draft of the wire in the rolling step is not more than 84%, preferably not more than 80%.

When the step of heat-treating the wire is carried out in the pressurized atmosphere of at least 1 MPa and less than 50 MPa, the oxide superconducting wire is compressed also in the heat-treating step. Also when the step of rolling the wire is carried out with the draft of not more than 84% lower than the conventional draft, therefore, the raw material powder is compressed in the subsequent heat-treating step and hence the density of the superconducting filaments can be increased as a result. On the other hand, the step of rolling the step is carried out with the draft of not more than 84% lower than the conventional draft so that voids are hardly formed in the raw material powder, whereby formation of voids extending perpendicularly to the longitudinal direction of the oxide superconducting wire can be suppressed. The critical current density of the oxide superconducting wire can be improved for the aforementioned reasons. Further, the step of rolling the wire is so carried out with the draft of not more than 80% that no voids are formed in the raw material powder, whereby formation of voids extending perpendicularly to the longitudinal direction of the oxide superconducting wire can be further suppressed.

In this specification, the draft (%) is defined in the following equation:

$$\text{Draft}(\%)=(1-\text{thickness of rolled wire/thickness of unrolled wire})\times 100$$

Preferably in the aforementioned method of manufacturing an oxide superconducting wire, a plurality of heat treatments are performed on the wire, and at least one heat treatment among the plurality of heat treatments is carried out in a pressurized atmosphere having a total pressure of at least 1 MPa and less than 50 MPa.

Thus, it is possible to suppress formation of voids between oxide superconducting crystals and blisters of the oxide superconducting wire caused in the heat treatment.

BRIEF DESCRIPTION OF THE INVENTION

FIG. 3 is a schematic sectional view of a hot isostatic pressing (HIP) apparatus.

FIGS. 4A to 4D are conceptual diagrams showing behavior of voids between oxide superconducting crystals stepwise.

Figure 15A:
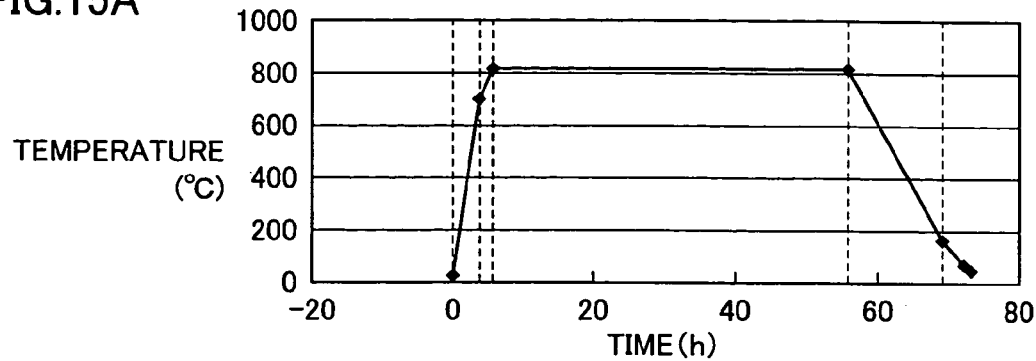
Figure 15B:
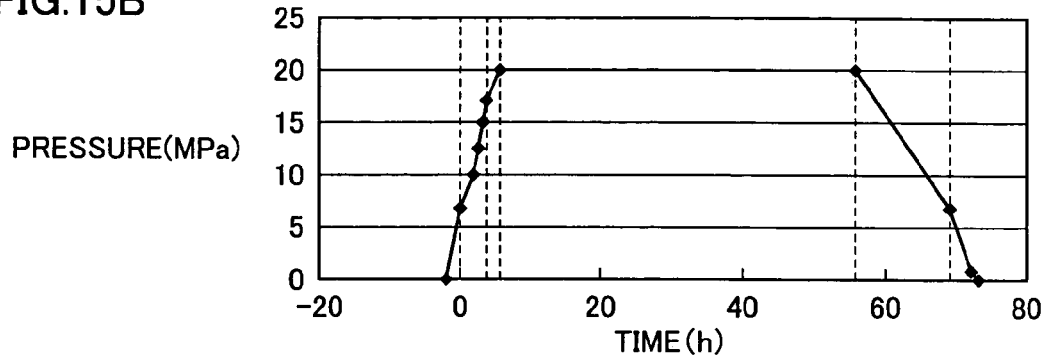
Figure 15C:
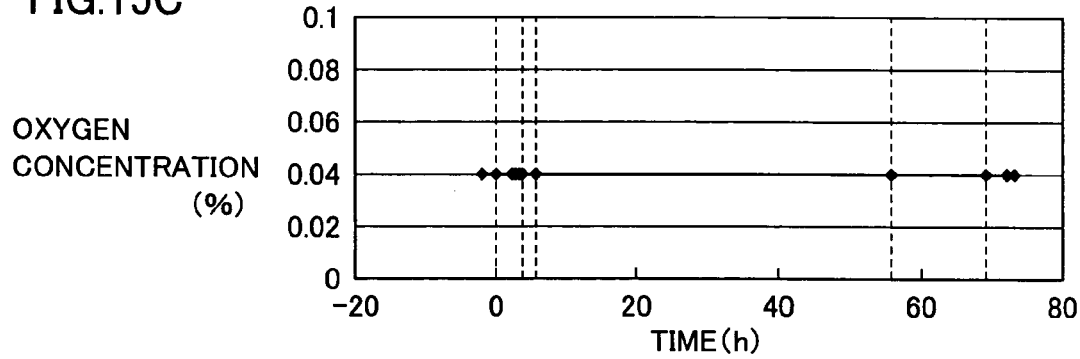
Figure 15D:
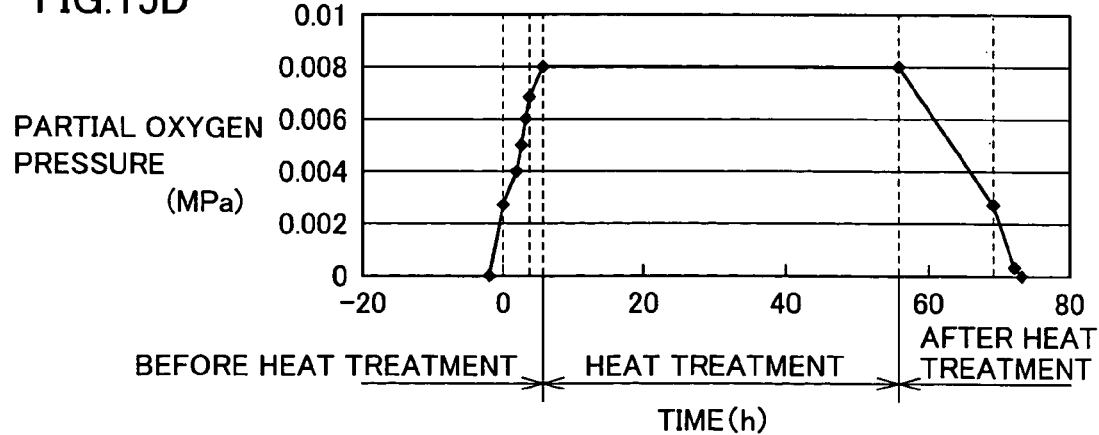

FIG. 15A is a diagram showing the relation between temperatures in a heat-treating step and time in a case where a silver ratio in the second embodiment is 1.5, FIG. 15B is a diagram showing the relation between pressures in the heat-treating step and time in the case where the silver ratio in the second embodiment is 1.5, FIG. 15C is a diagram showing the relation between oxygen concentrations in the heat-treating step and time in the case where the silver ratio in the second embodiment is 1.5, and FIG. 15D is a diagram showing the relation between partial oxygen pressures in the heat-treating step and time in the case where the silver ratio in the second embodiment is 1.5.

Figure 16:
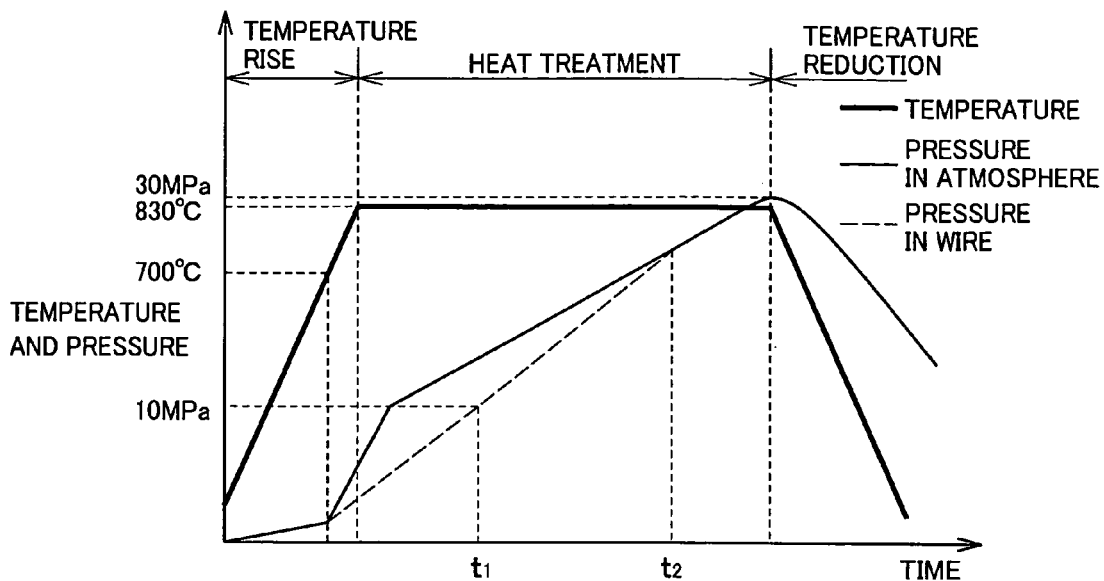

FIG. 16 is a diagram showing the relation between temperatures and pressures in a heat-treating step and time according to a fifth method in the second embodiment.

Figure 17:
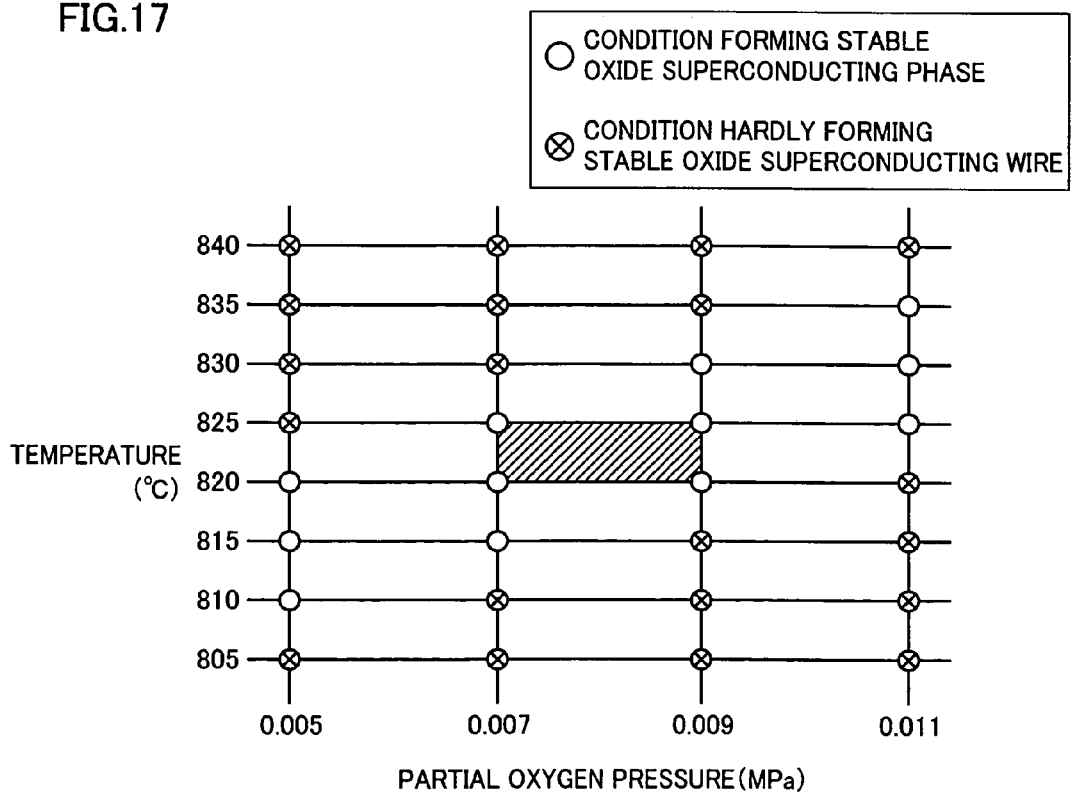

FIG. 17 is a diagram showing the optimum combination of a temperature and a partial oxygen pressure in a heat treatment.

Figure 18:
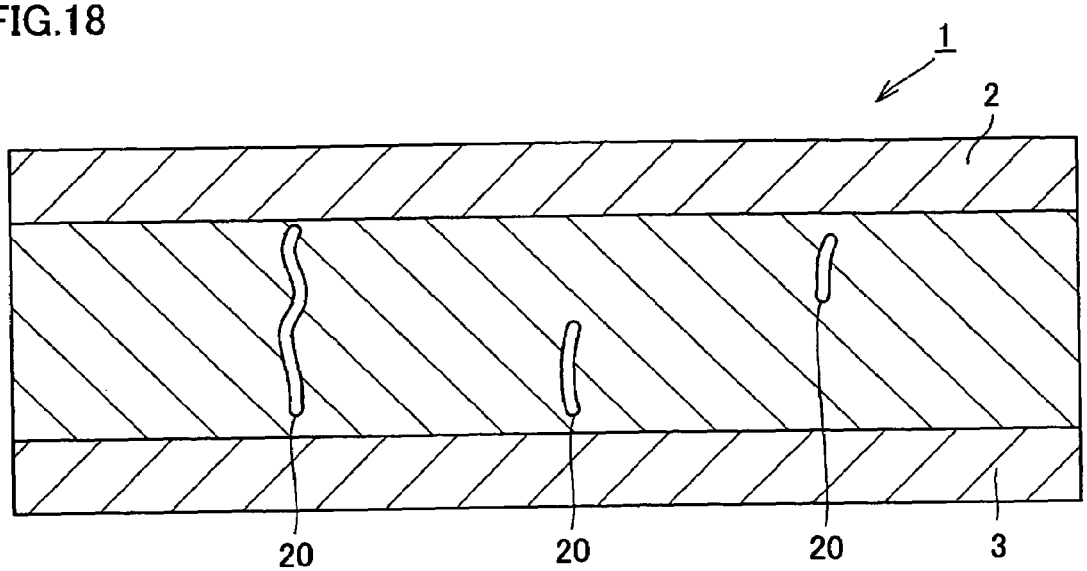

FIG. 18 is a partially fragmented perspective view conceptually showing the structure of an oxide superconducting wire having remaining voids.

Figure 19:
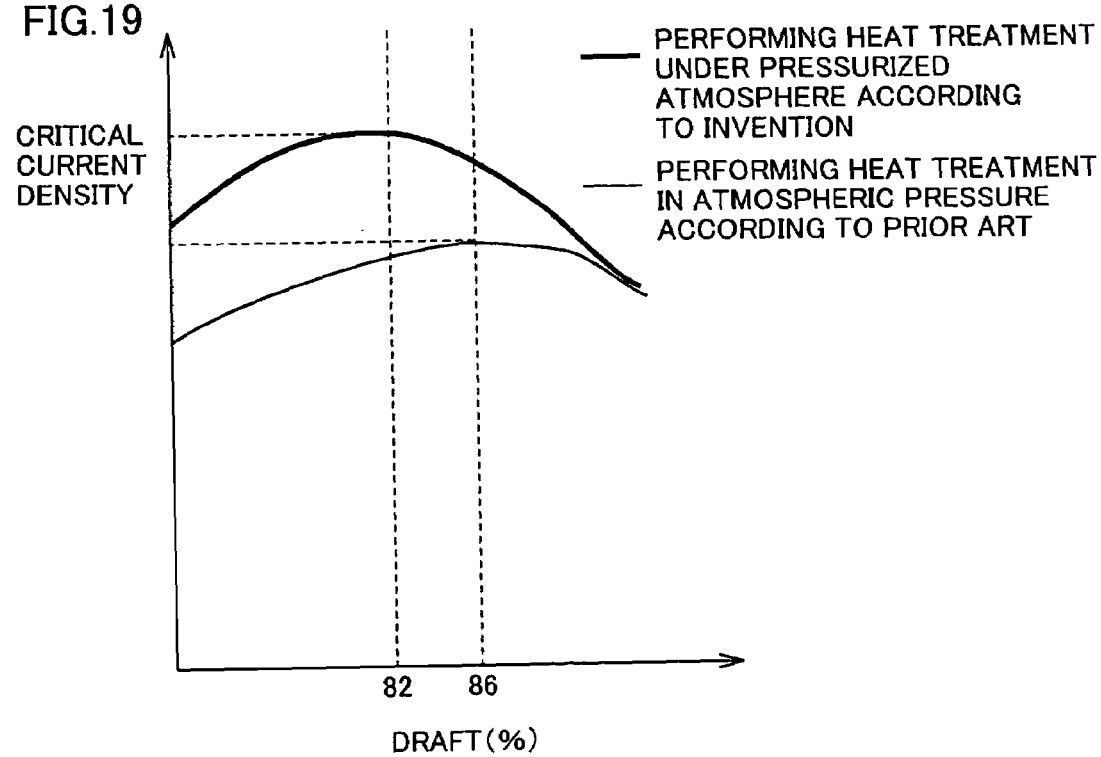

FIG. 19 is a diagram schematically showing the relation between drafts and critical current densities in primary rolling in an oxide superconducting wire.

BEST MODES FOR CARRYING OUT THE INVENTION

Embodiments of the present invention are now described with reference to the drawings.

First Embodiment

A multifilamentary oxide superconducting wire, for example, is described with reference to FIG. 1. An oxide superconducting wire 1 has a plurality of oxide superconductor filaments 2 extending in the longitudinal direction and a sheath part 3 covering the same. The material for each of the plurality of oxide superconductor filaments 2 preferably has a Bi—Pb—Sr—Ca—Cu—O composition, for example, and a material including a Bi2223 phase having atomic ratios of (bismuth and lead):strontium:calcium:copper approximately expressed as 2:2:2:3 is optimum in particular. The material for the sheath part 3 consists of silver, for example.

While a multifilamentary wire has been described in the above, an oxide superconducting wire having a single-core wire structure comprising a single oxide superconductor filament 2 covered with a sheath part 3 may alternatively be employed.

A method of manufacturing the aforementioned oxide superconducting wire is now described.

Figure 2:
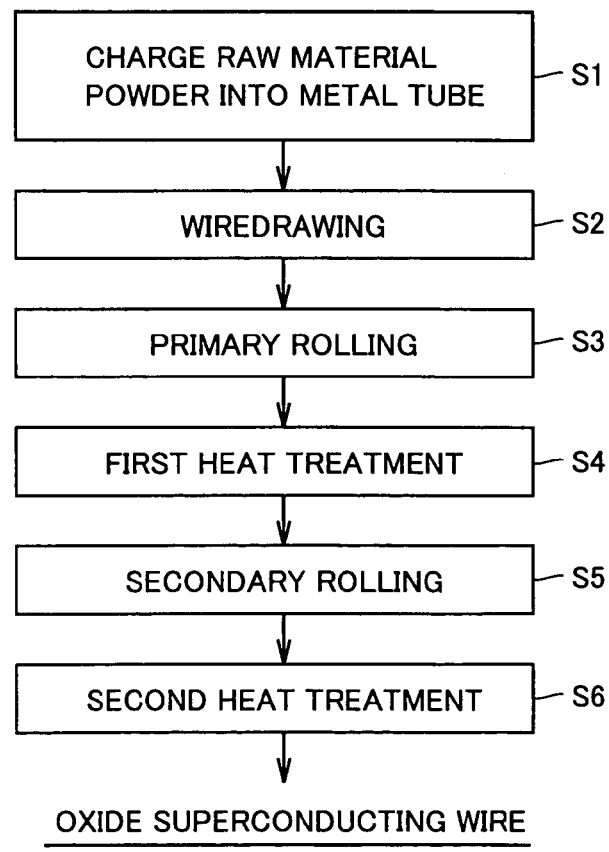
FIG. 2 is a diagram showing a manufacturing step for an oxide superconducting wire.

Referring to FIG. 2, raw material powder of an oxide superconductor is first charged into a metal tube (step S1). The raw material powder of the oxide superconductor consists of a material including a Bi2223 phase, for example.

Silver or a silver alloy having high heat conductivity is preferably employed for the metal tube. Thus, heat generated when the superconductor partially causes quenching can be quickly removed from the metal tube.

Then, the metal tube charged with the raw material powder is worked into a wire having a desired diameter by wiredrawing (step S2). Thus, a wire formed by covering the raw material powder of the oxide superconductor with a metal is obtained. Primary rolling is performed on this wire (step S3), followed by a first heat treatment (S4). An oxide superconducting phase is generated from the raw material powder due to these operations. Secondary rolling is performed on this heat-treated wire (step S5). Thus, voids resulting from the first heat treatment are removed. A second heat treatment is performed on the secondarily rolled wire (step S6). Sintering of the oxide superconducting phase progresses while the oxide superconducting phase is simultaneously converted to a single phase through the second heat treatment.

Figure 1:
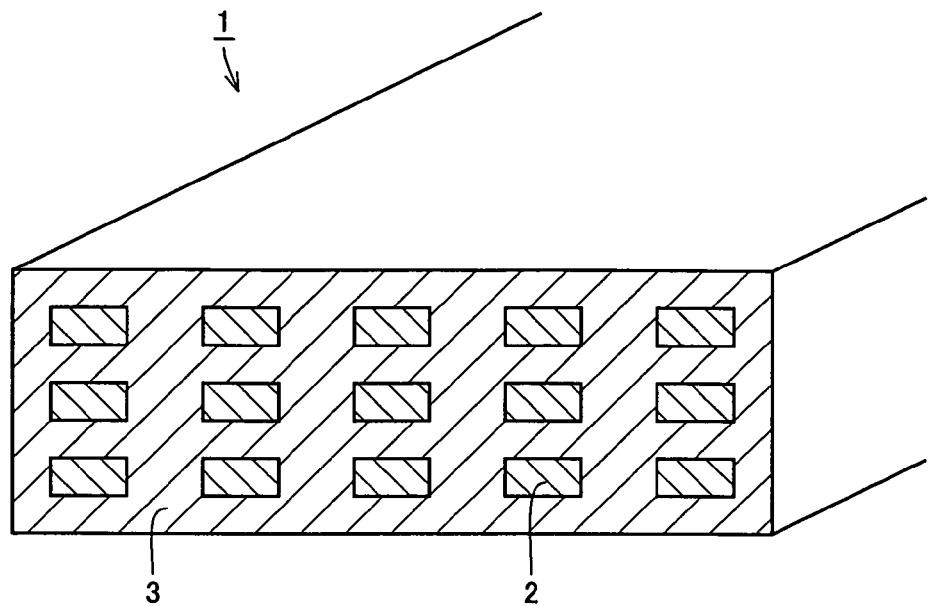
FIG. 1 is a partially fragmented perspective view conceptually showing the structure of an oxide superconducting wire.

The oxide superconducting wire shown in FIG. 1, for example, can be manufactured according to the aforementioned manufacturing method.

In this embodiment, at least either the first heat treatment (step S4) or the second heat treatment (step S6) is performed in a pressurized atmosphere to which a pressure of at least 1 MPa and less than 50 MPa is applied as the total pressure.

The heat treatment in this pressurized atmosphere is performed by hot isostatic pressing (HIP), for example. This hot isostatic pressing is now described.

Referring to FIG. 3, an apparatus 13 for performing hot isostatic pressing is constituted of a pressure vessel cylinder 6, a top cover 5 and a bottom cover 11 closing both ends of the pressure vessel cylinder 6, a gas inlet 4 provided on the top cover 5 for introducing gas into the pressure vessel cylinder 6, a heater 9 heating a treated object 8, a thermal barrier 7 and a bearer 10 supporting the treated object 8.

According to this embodiment, the bearer 10 supports the wire obtained by charging the raw material powder into the metal tube and thereafter wiredrawing/rolling the same as the treated object 8 in the pressure vessel cylinder 6. In this state, prescribed gas is introduced into the pressure vessel cylinder 6 through the gas inlet 4 thereby forming a pressurized atmosphere of at least 1 MPa and less than 50 MPa in the pressure vessel cylinder 6 and heating the wire 8 with the heater 9 to a prescribed temperature under this pressurized atmosphere. This heat treatment is preferably performed in an oxygen atmosphere, and the partial oxygen pressure is preferably at least 0.003 MPa and not more than 0.02 MPa. Thus, the wire 8 is subjected to the heat treatment by hot isostatic pressing.

According to this embodiment, the heat treatment is performed in the pressurized atmosphere of at least 1 MPa and less than 50 MPa as hereinabove described, to mainly attain the following three effects:

First, the number of voids formed between oxide superconducting crystals in the heat treatment can be reduced.

The inventors have found that the number of voids formed between oxide superconducting crystals mainly in a heat treatment can be remarkably reduced by performing the heat treatment in a pressurized atmosphere of at least 1 MPa as compared with a case of less than 1 MPa.

Referring to FIGS. 4A to 4D, the contact area between oxide superconducting crystals formed in a heat treatment increases due to plastic flow when the heat treatment is performed in a pressurized atmosphere, to reduce the number of voids of several $\mu$m to several 10 $\mu$m present between the superconducting crystals (FIG. 4A→FIG. 4B). When held in this state, creep deformation is caused as shown in FIG. 4C so that voids present on the junction interface shrink while a contaminative portion such as an oxide film is partially broken/decomposed to cause diffusion of atoms and progress sintering. The voids between the superconducting crystals finally substantially disappear as shown in FIG. 4D, and a stable junction interface is formed.

To feed a current to a superconducting wire is to feed a current between superconducting crystals constituting the superconducting wire. What limits the quantity of a current feedable while keeping a superconducting state (causing no electric resistance) in a coolant (e.g., liquid nitrogen or helium, or a refrigerator) for employing a superconducting wire is generally the junction between superconducting crystals having a weak superconducting state (the superconducting crystals have stronger superconductivity than the junction between the crystals). Voids inevitably remain in the junction between the superconducting crystals in ordinary atmospheric baking. When the number of voids between the superconducting crystals is reduced, therefore, the performance of the superconducting wire is so improved that reduction of the critical current density can be prevented.

More specifically, the sintering density of an oxide superconductor heat-treated in the atmospheric pressure was 80 to 90% as to an oxide superconducting wire containing a Bi2223 phase, while the sintering density of an oxide superconductor prepared according to the inventive manufacturing method by setting the total pressure of a pressurized atmosphere to 10 MPa was 93 to 96%, and reduction of the number of voids formed between oxide superconducting crystals was observed.

Second, the oxide superconducting wire can be prevented from blisters formed in the heat treatment.

Figure 5:
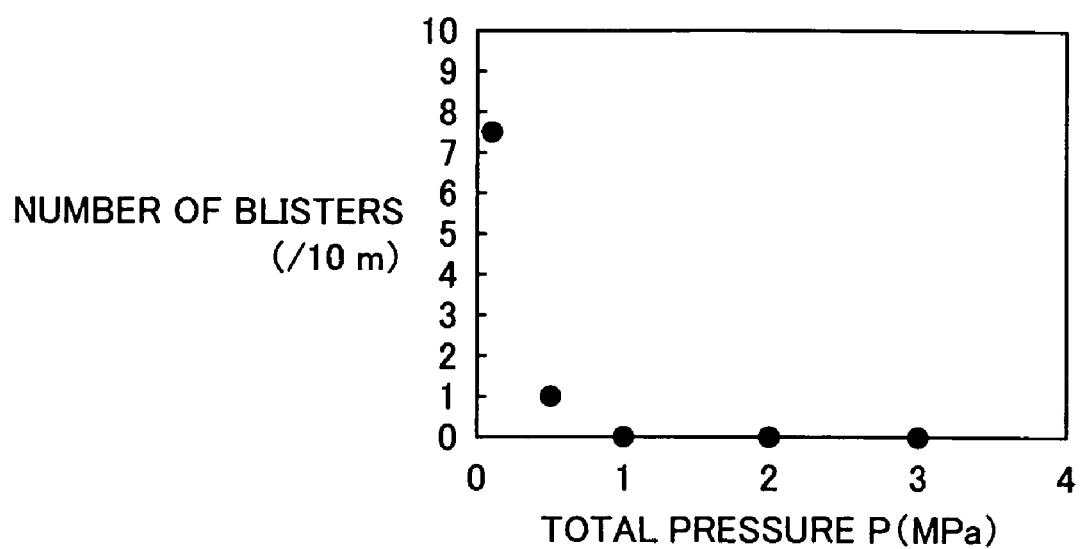
FIG. 5 is a diagram showing the relation between the total pressure P (MPa) of a pressurized atmosphere and the number (/10 m) of blisters of a wire.

The inventors have investigated the number of blisters formed in a heat-treated wire when varying the total pressure for heat-treating an oxide superconducting wire in a pressurized atmosphere. Referring to FIG. 5, it is understood that the number of blisters in the oxide superconducting wire is remarkably reduced when the total pressure of the pressurized atmosphere exceeds 0.5 MPa and the blisters in the oxide superconducting wire substantially disappear when the total pressure is in excess of 1 MPa. Such results have been obtained conceivably for the following reason:

Powder of an oxide superconductor is generally charged into a metal tube at a filling factor of about 80% of the theoretical density before sintering, and hence gas is present in voids of the powder. The gas in the voids of the powder causes cubic expansion when reaching a high temperature in a heat treatment, to blister the wire. According to this embodiment, however, the heat treatment is performed in the pressurized atmosphere of at least 1 MPa, and hence the pressure outside the metal tube can increase beyond that in the metal tube. Thus, the wire is conceivably prevented from blisters caused by the gas in the voids of the powder.

The inventors have further studied the cause for blisters of the wire, to also recognize that adsorbates such as carbon (C), water ($H_2O$) and oxygen ($O_2$) adhering to the raw material powder of the oxide superconductor are vaporized during sintering and the volume in the metal tube expands due to this gas to blister the wire. However, such blisters the wire resulting from vaporization of the adsorbates to the powder can also conceivably be prevented since the external pressure can increase beyond the intermetallic internal pressure by performing the heat treatment in the pressurized atmosphere of at least 1 MPa.

Thus, it is conceivably possible to substantially remove not only blisters resulting from the gas present in the voids of the raw material powder of the oxide superconductor but also blisters resulting from vaporization of the adsorbates adhering to the surfaces of particles thereof. The blisters of the oxide superconducting wire cause reduction of the critical current density, and hence reduction of the critical current density can be prevented by preventing the wire from blisters.

Third, the partial oxygen pressure can be readily controlled in the heat treatment.

The inventors have found that a 2223 phase of a Bi-based oxide superconductor is stably formed when the partial oxygen pressure is controlled to at least 0.003 MPa and not more than 0.02 MPa regardless of the total pressure. A hetero phase such as $Ca_2PbO_4$ is formed if the partial oxygen pressure exceeds 0.02 MPa, while the Bi2223 phase is hardly formed and the critical current density is reduced if the partial oxygen pressure is less than 0.003 MPa.

Figure 6:
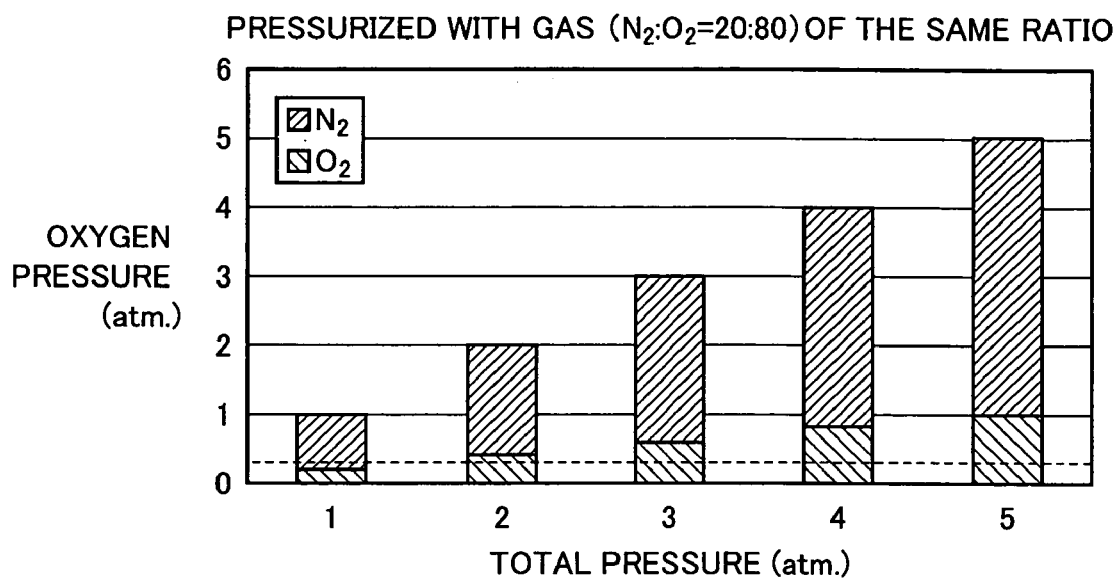
FIG. 6 is a diagram showing total pressures and partial oxygen pressures as to a gas mixture containing about 80% of nitrogen and about 20% of oxygen.
Figure 7:
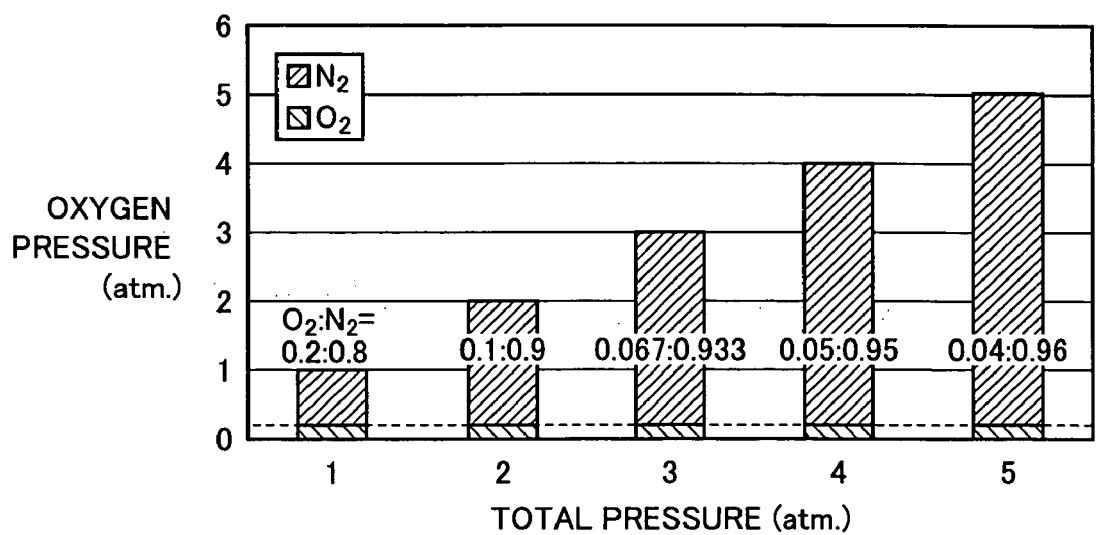
FIG. 7 is a diagram showing the relation between total pressures and oxygen concentration values in a case of setting the partial oxygen pressure constant.

Referring to FIG. 6, a Bi2223 phase is stably formed without controlling the partial oxygen pressure when the total pressure of the pressurized atmosphere is the atmospheric pressure of 1 atm (0.1 MPa), for example, since the partial oxygen pressure is equivalent to the level of 0.2 atm (0.02 MPa) shown by a dotted line. As the total pressure of the pressurized atmosphere increases to 2 atm, 3 atm . . . , however, the partial oxygen pressure also increases to exceed the level of 0.2 atm shown by the dotted line. Consequently, the Bi2223 phase is not stably formed. Therefore, the partial oxygen pressure must be controlled to at least 0.003 MPa and not more than 0.02 MPa by varying the mixing ratio of oxygen gas in a gas mixture, as shown in FIG. 7. A dotted line in FIG. 7 shows the level of 0.2 atm (0.02 MPa) similarly to the dotted line in FIG. 6.

In practice, the partial oxygen pressure is controlled by monitoring the total pressure and the oxygen concentration. In other words, the partial oxygen pressure is calculated by multiplying the value of the total pressure by the oxygen concentration.

Therefore, if the total pressure is 50 MPa, for example, the oxygen concentration is 0.01% when the heat treatment is performed with a partial oxygen pressure of 0.005 MPa. Therefore, the injected gas mixture must be controlled by measuring the oxygen concentration of 0.01%. However, the oxygen concentration of 0.01% is substantially identical to a measurement error, and hence it is difficult to control the oxygen gas in the injected gas mixture by correctly measuring this oxygen concentration. According to this embodiment, the total pressure in the pressurized atmosphere is set to less than 50 MPa so that the concentration of the oxygen gas in the injected gas mixture can be kept high to some extent by reducing influence by a measurement error of the oxygen concentration, whereby the partial oxygen pressure can be readily controlled.

When performing the heat treatment in the pressurized atmosphere of at least 1 MPa, the decompression speed is preferably controlled so that no abrupt decompression takes place in the pressurized atmosphere in the heat treatment and after the heat treatment.

When the heat treatment is performed in the pressurized atmosphere of at least 1 MPa, external gas conceivably enters the wire through fine holes on the surface of the wire to provide the same pressure as the external one. The inventors have found that emission of gas from the inner part cannot follow reduction of the external pressure and the internal pressure increases to form blisters when the external pressure is reduced due to abrupt decompression in such a high-pressure atmosphere.

In order to prevent such blisters, therefore, a gas mixture of inert gas such as Ar (argon) or $N_2$ (nitrogen) and $O_2$ gas is preferably injected into the vessel in the heat treatment for setting the total pressure constant. In temperature reduction immediately after the heat treatment, further, the gas mixture of the inert gas and the oxygen gas is injected into the vessel to compensate for reduction of the pressure resulting from temperature reduction. Formation of blisters resulting from abrupt decompression can be prevented by controlling the decompression speed in the heat treatment and at the temperature reduction time immediately after the heat treatment.

Figure 8A:
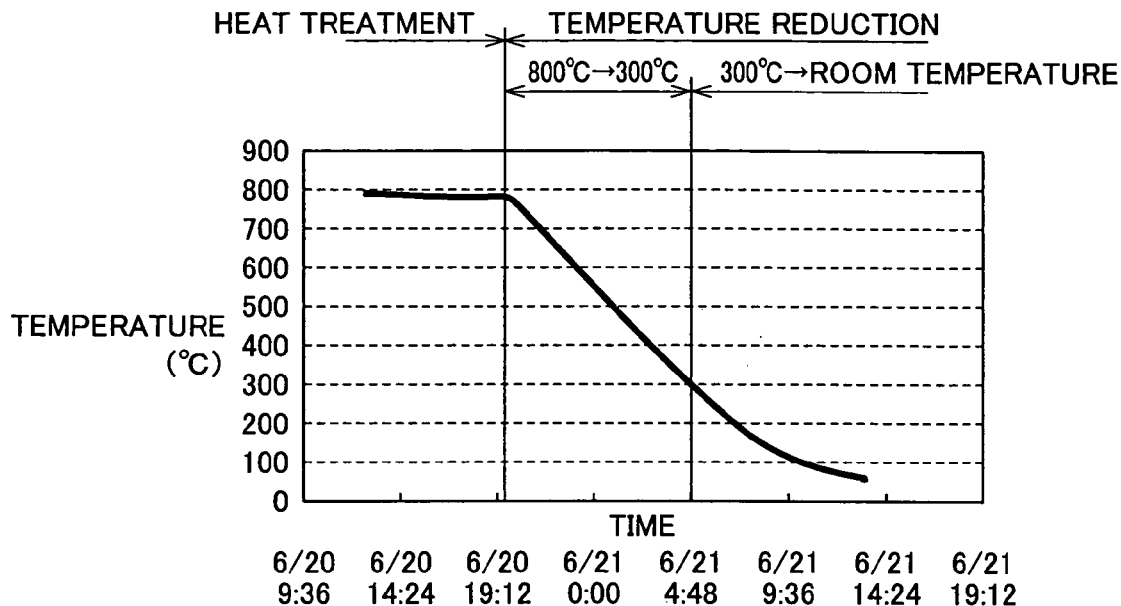
FIG. 8A is a diagram showing the relation between time and temperatures of a wire in a case of controlling a decompression speed immediately after a heat treatment.
Figure 8B:
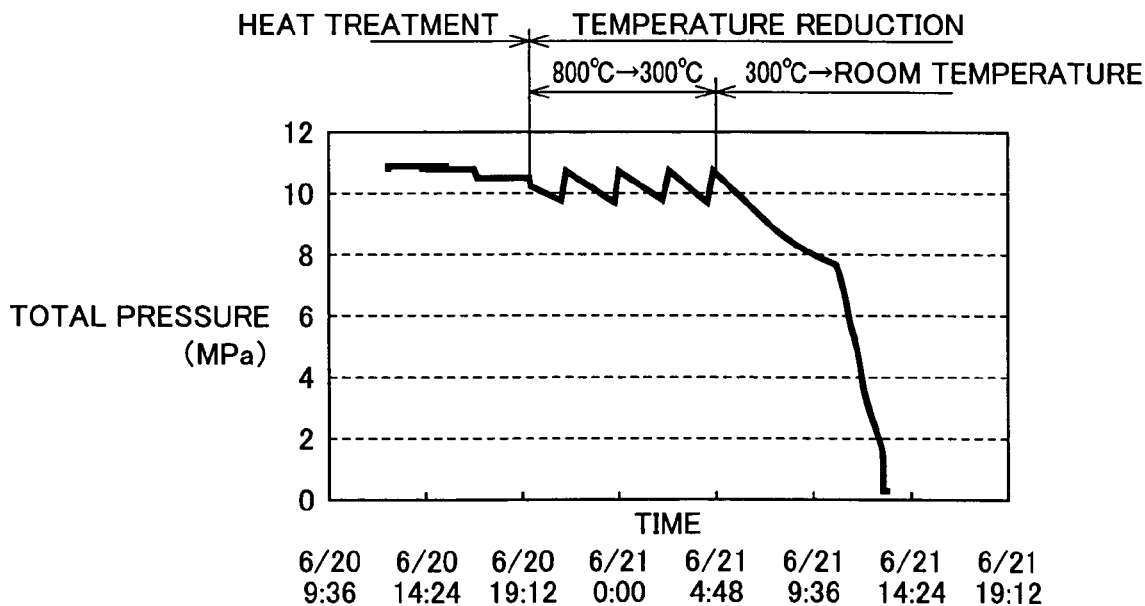
FIG. 8B is a diagram showing the relation between time and total pressures in a vessel in the case of controlling the decompression speed immediately after the heat treatment.

Referring to FIGS. 8A and 8B, the total pressure is controlled to be constant as shown in FIG. 8B in a heat treatment (at a temperature of about 800° C.) shown in FIG. 8A. In other words, oxygen gas in a heating vessel is consumed in the heat treatment due to oxidation of a bearer supporting a wire in the vessel, and hence the pressure in the vessel is reduced. In order to prevent this, a gas mixture is injected into the vessel for keeping the pressure constant. In temperature reduction (in a temperature range of about 800 to about 300° C.) immediately after the heat treatment shown in FIG. 8A, the gas mixture is injected into the vessel to compensate for reduction of the pressure resulting from the temperature reduction as shown in FIG. 8B, for controlling the decompression speed to not more than a constant level. In other words, the pressure of the gas also starts to abruptly lower on the basis of the state equation of gas due to abrupt reduction of the temperature, and hence temperature reduction must be loosened by injecting the gas mixture. When not more than 300° C., the temperature is low as compared with the case of about 800° C. to about 300° C., and hence the pressure in the wire is already sufficiently low. Therefore, the wire is conceivably not blistered also when the decompression speed is not controlled.

The inventors have found that the range of the decompression speed necessary for preventing the oxide superconducting wire from blisters varies with the ratio (silver ratio) of the area of a metal portion to the area of an oxide superconductor portion in a cross section of the heat-treated wire. In other words, the decompression speed in temperature reduction (in the range of 800° C. to 300° C.) immediately after the heat treatment is preferably not more than 0.05 MPa/min. when the silver ratio is 1.5, and the decompression speed in temperature reduction (in the temperature range of 800° C. to 300° C.) immediately after the heat treatment is preferably not more than 0.03 MPa/min. when the silver ratio is 3.0.

Second Embodiment

Figure 9A:
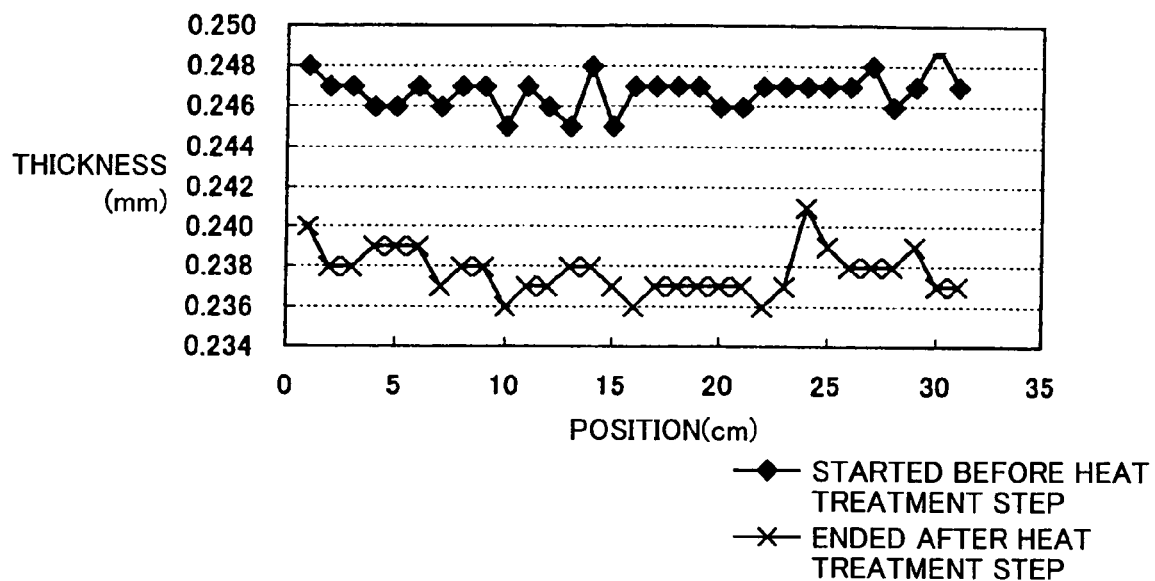
FIG. 9A is a graph showing thicknesses of wires of oxide superconducting wires having no pinholes before and after a heat treatment in a pressurized atmosphere.
Figure 9B:
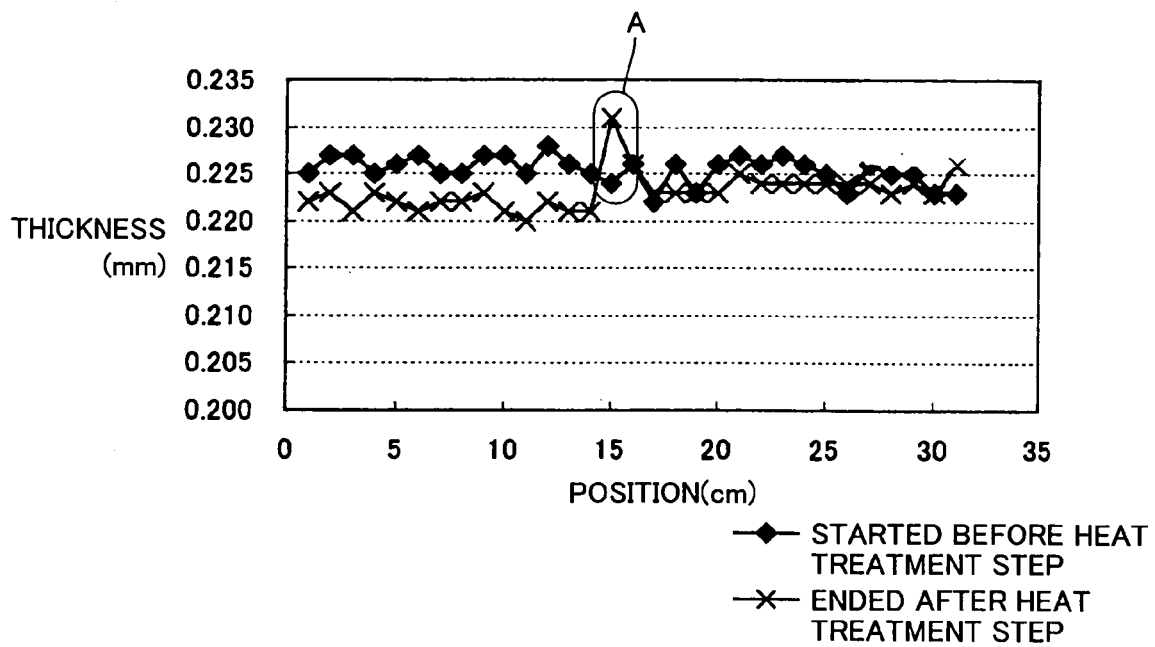
FIG. 9B is a graph showing thicknesses of wires of oxide superconducting wires having pinholes.

Heat treatment conditions in FIGS. 9A and 9B are a total pressure of 20 MPa, a partial oxygen pressure of 0.008 MPa, a temperature of 825° C. in an atmosphere, and a heat treatment time of 50 hours. Referring to FIG. 9A, the thickness of an oxide superconducting wire having no pinholes is reduced by about 0.006 mm to 0.01 mm after a heat treatment. This is because formation of voids between oxide superconducting crystals and blisters of the oxide superconducting wire is suppressed due to the heat treatment in a pressurized atmosphere having the total pressure of 20 MPa. Referring to FIG. 9B, on the other hand, the thickness of an oxide superconducting wire having pinholes is reduced only by about 0.002 mm to 0.005 mm after the heat treatment, and formation of voids between oxide superconducting crystals and blisters of the oxide superconducting wire is not sufficiently suppressed. The thickness of a portion (portion A) having pinholes in the wire increases after the heat treatment as compared with that before the heat treatment.

Thus, it has been recognized that formation of voids and blisters can be effectively suppressed by performing the heat treatment in the pressure range (at least 1 MPa and less than 50 MPa) according to the first embodiment when there are no pinholes while formation of voids and blisters cannot be sufficiently suppressed by merely performing the heat treatment in the pressure range (at least 1 MPa and less than 50 MPa) according to the first embodiment when there are pinholes.

In the heat treatment in the pressurized atmosphere according to the present invention, plastic flow and creep deformation take place in the superconducting crystals formed in the heat treatment due to the high pressure of at least 1 MPa outside the wire, whereby voids between the oxide superconducting crystals formed in the heat treatment are suppressed. Further, the gas in the voids of the oxide superconducting crystal powder formed in the heat treatment or the gas adhering to the oxide superconducting crystal powder formed in the heat treatment can be inhibited from expansion in the heat treatment due to the pressure from outside the metal tube, whereby the oxide superconducting wire is inhibited from formation of blisters. Consequently, reduction of the critical current density resulting from voids and blisters is prevented.

In a wire having pinholes, however, pressurizing gas penetrates into the wire through the pinholes also when the aforementioned heat treatment in the pressurized atmosphere is performed, and hence no difference is caused between the internal and external pressures of the wire and formation of voids and blisters is not sufficiently suppressed by pressurization. Consequently, the effect of preventing reduction of the critical current density is reduced.

In this regard, the inventors have made deep studies, to find techniques capable of sufficiently suppressing formation of voids and blisters by providing a wire having no pinholes before a heat treatment.

A first technique is to set the integumentary thickness of the oxide superconducting wire to at least 200 μm after the rolling (step S3 or S5) and before the heat treatment (step S4 or step S6) in FIG. 2.

A second technique is to set the surface roughness Ry of a portion, coming into contact with the wire, of the roll employed for the rolling (step S3 or S5) in FIG. 2 to not more than 320 μm.

The third technique is to plate the oxide superconducting wire with silver or a silver alloy after the rolling (step S3 or S5) and before the heat treatment (step S4 or S6) in FIG. 2.

These techniques are now specifically described.

Figure 10:
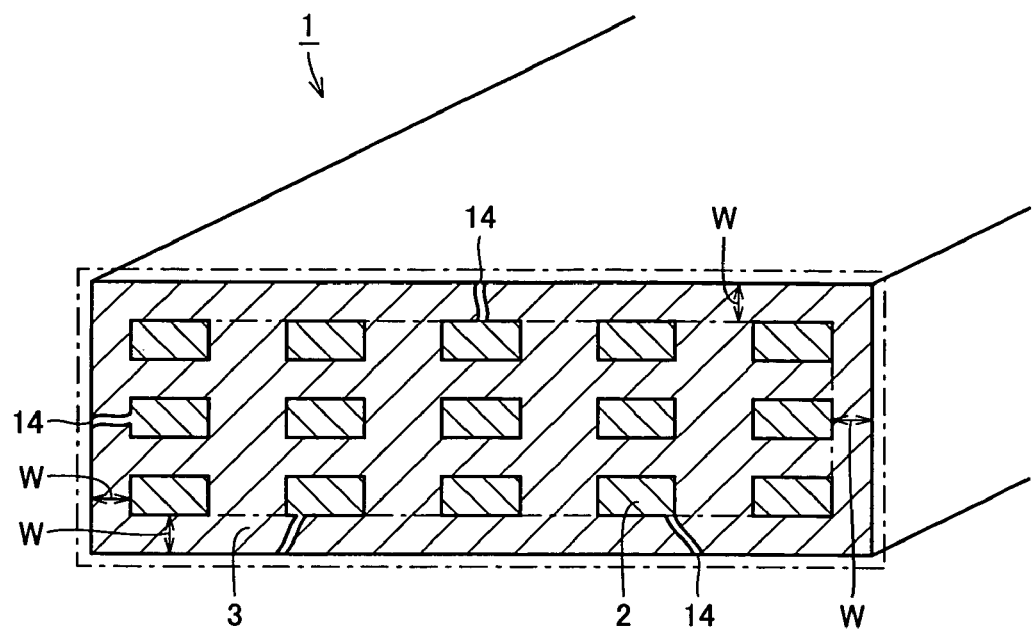
FIG. 10 is a partially fragmented perspective view conceptually showing the structure of an oxide superconducting wire having pinholes.

The inventors have found that no pinholes are formed in rolling (step S3 or S5) when the integumentary thickness W of the oxide superconducting wire after the rolling (step S3 or S5) and before the heat treatment (step S4 or S6) in FIG. 2 is set to at least 200 μm in every portion as the first technique. The term "integumentary thickness W" denotes the distance W between each of oxide superconductor filaments 2 arranged along the outer peripheral portion in a section of a wire 1 and the outer surface of the wire 1 after rolling, as shown in FIG. 10. The reason why no pinholes 14 are formed when the integumentary thickness W is set to at least 200 μm is conceivably as follows:

The pinholes 14 are mainly formed to pass from outside up to the oxide superconductor filaments 2 since the surface of the wire 1 is roughened due to friction between the wire 1 and a roll for rolling. When the oxide superconducting wire 1 is so rolled that the integumentary thickness W thereof is at least 200 μm in every portion after the rolling, however, no holes pass from outside up to the oxide superconductor filaments 2 even if the surface of the wire 1 is roughened due to the rolling, and hence no pinholes 14 are conceivably formed. The remaining structure of FIG. 10 other than the above is substantially identical to the structure shown in FIG. 1, and hence identical members are denoted by identical reference numerals and redundant description is not repeated.

The inventors have found that, even if the integumentary thickness W of the rolled oxide superconducting wire is less than 200 μm, a wire having no pinholes 14 is obtained before the heat treatment when the aforementioned second and third techniques are employed so that formation of voids and blisters is consequently suppressed by the heat treatment in the pressurized atmosphere and reduction of the critical current density is effectively prevented.

Figure 11:
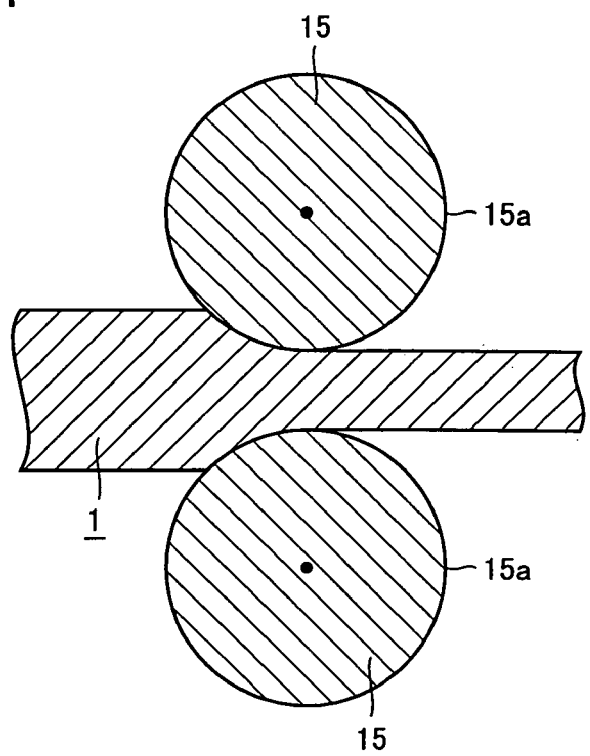
FIG. 11 is a schematic sectional view showing a rolling method in a second embodiment.

Referring to FIG. 11, rolling is a working method passing a plate-shaped or bar-shaped material between a plurality of (generally two) rotating rolls 15 for reducing the thickness or the sectional area thereof while molding the section to a target shape at the same time. In this rolling, an oxide superconducting wire 1 is drawn into the space between the plurality of rolls 15 due to frictional force from the rolls 15 and deformed due to compressive force received from the surfaces 15a of the rolls 15.

In the second technique, the rolls 15 having surface roughness Ry of not more than 320 μm on the surfaces 15a coming into contact with the wire 1 are employed in at least either the primary rolling (step S3) or the secondary rolling (step S5) shown in FIG. 2.

When the surface roughness Ry of the surfaces 15a of the rolls 15 employed in the rolling is not more than 320 μm, friction between the wire 1 and the surfaces 15a of the rolls 15 is so reduced that the surface of the wire 1 is hardly roughened and the wire 1 is obtained with no pinholes regardless of the integumentary thickness of the wire 1. Therefore, no pressurizing gas penetrates into the wire 1 through pinholes in the heat-treating step. Thus, formation of voids and blisters is suppressed due to the aforementioned step of performing the heat treatment in the pressurized atmosphere regardless of the integumentary thickness W of the wire 1, whereby reduction of the critical current density is effectively prevented.

Figure 12:
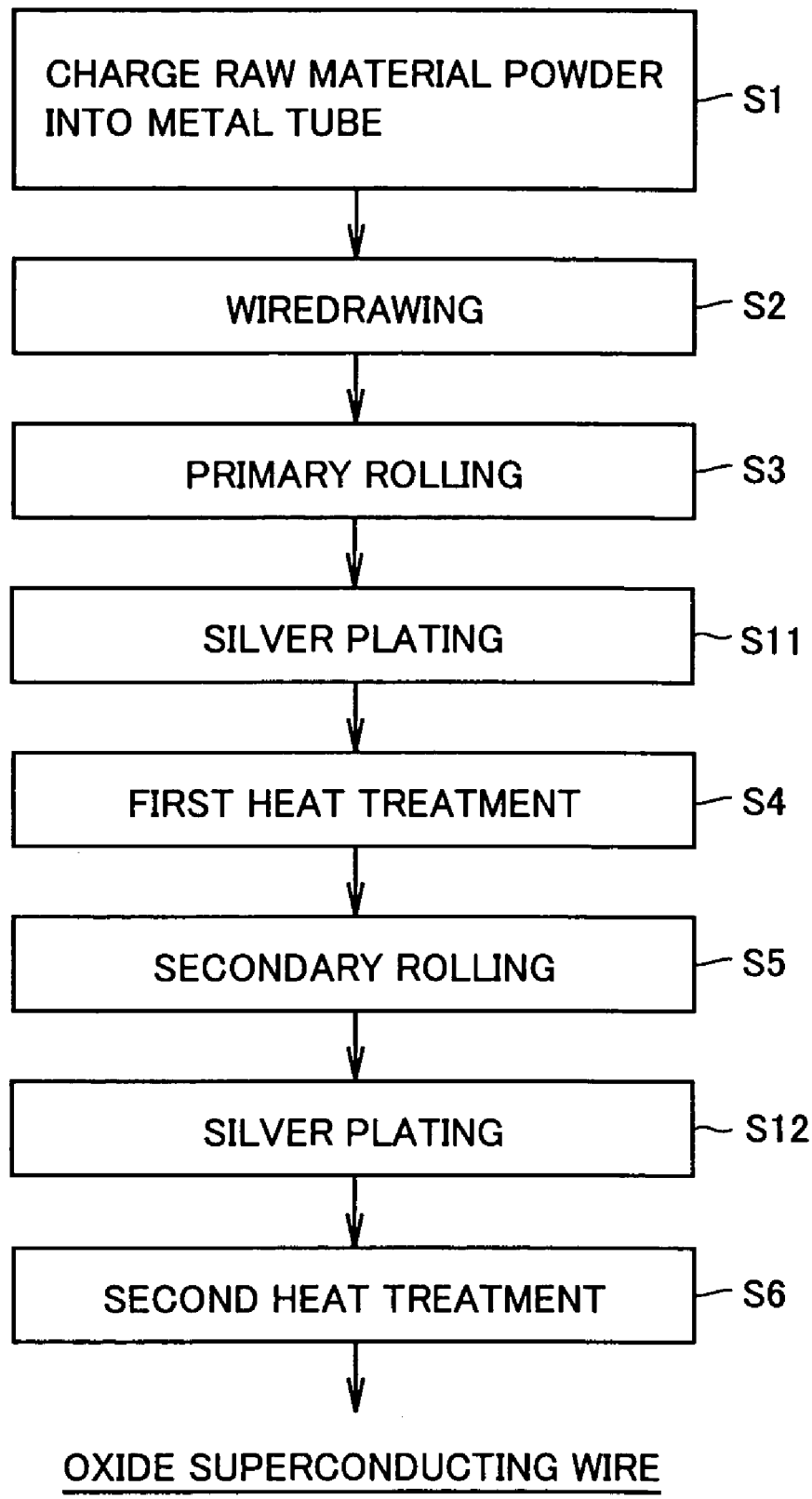
FIG. 12 is a diagram showing another manufacturing step for an oxide superconducting wire.

In the third technique, a step (step S11 or S12) of plating the surface of the wire with silver or a silver alloy is carried outer after rolling (step S3 or S5) and before a heat treatment (step S4 or S6), as shown in FIG. 12. The steps are substantially identical to those of the method shown in FIG. 2 except that the plating step (step S11 or S12) is added, and hence corresponding steps are denoted by corresponding reference numerals and redundant description is not repeated.

Figure 13:
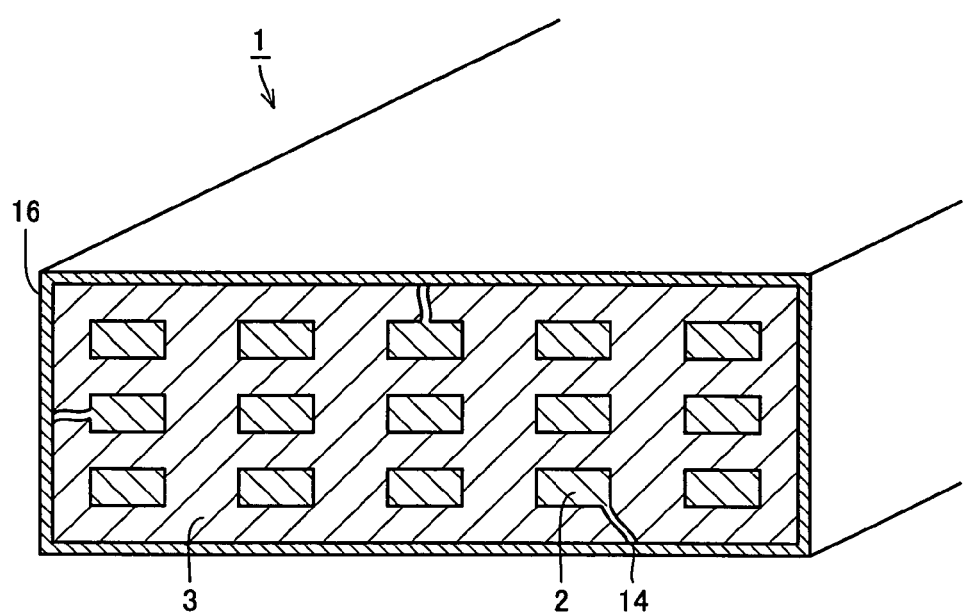
FIG. 13 is a partially fragmented sectional view conceptually showing the structure of an oxide superconducting wire after a step of plating the wire with silver or a silver alloy.

Referring to FIG. 13, the outer periphery of a sheath part 3 is plated with silver or a silver alloy 16, so that externally opening pinholes 14 are blocked with the silver or silver alloy 16. The remaining structure is substantially identical to the structure shown in FIG. 1, and hence identical members are denoted by identical reference numerals and redundant description is not repeated.

In general, the silver ratio of the oxide superconducting wire 1 is minimized in order to increase the quantity of a superconducting current feedable per unit area. In the wire 1 having a small silver ratio, however, the integumentary thickness W cannot be increased due to the small ratio of a metal portion. Therefore, the integumentary thickness W is less than 200 μm in the wire 1 having a small silver ratio, and pinholes 14 are readily formed in a treatment (e.g., rolling) before the heat-treating step. When the wire 1 has pinholes 14, formation of voids and blisters is not sufficiently suppressed by pressurization as described above. Consequently, the effect of preventing reduction of the critical current density is reduced. Thus, the surface of the wire 1 is plated with the silver or silver alloy 16 before the heat-treating step, so that the pinholes 14 are blocked with the silver or silver alloy 16 and disappear from the surface. Therefore, the heat-treating step is carried out after the pinholes 14 disappear from the wire 1, whereby no pressurizing gas penetrates into the wire 1 through the pinholes 14 in the heat-treating step. Thus, formation of voids and blisters is suppressed due to the aforementioned step of performing the heat treatment in the pressurized atmosphere regardless of the value of the integumentary thickness W of the wire 1 and the value of the surface roughness Ry of the rolls 15 employed for rolling, for effectively preventing reduction of the critical current density.

The inventors have found that formation of voids and blisters is suppressed and reduction of the critical current density is effectively prevented also in the wire 1 having the pinholes 14 when a fourth technique or a fifth technique described below is employed. In the fourth technique, the pressure is controlled to increase stepwise following temperature rise at a heat-up time before the heat treatment in at least either the first heat treatment (step S4) or the second heat treatment (step S6) shown in FIG. 2. In the fifth technique, the total pressure of the atmosphere is controlled to increase at a rate of at least 0.05 MPa/min. at the heat-up time before the heat treatment in at least either the first heat treatment (step S4) or the second heat treatment (step S6) shown in FIG. 2. In the heat treatment, the total pressure in the atmosphere is controlled to continuously increase. In temperature reduction immediately after the heat treatment, further, control is made to compensate for reduction of the pressure resulting from the temperature reduction (to add a pressure). First, the fourth technique is described.

Figure 14:
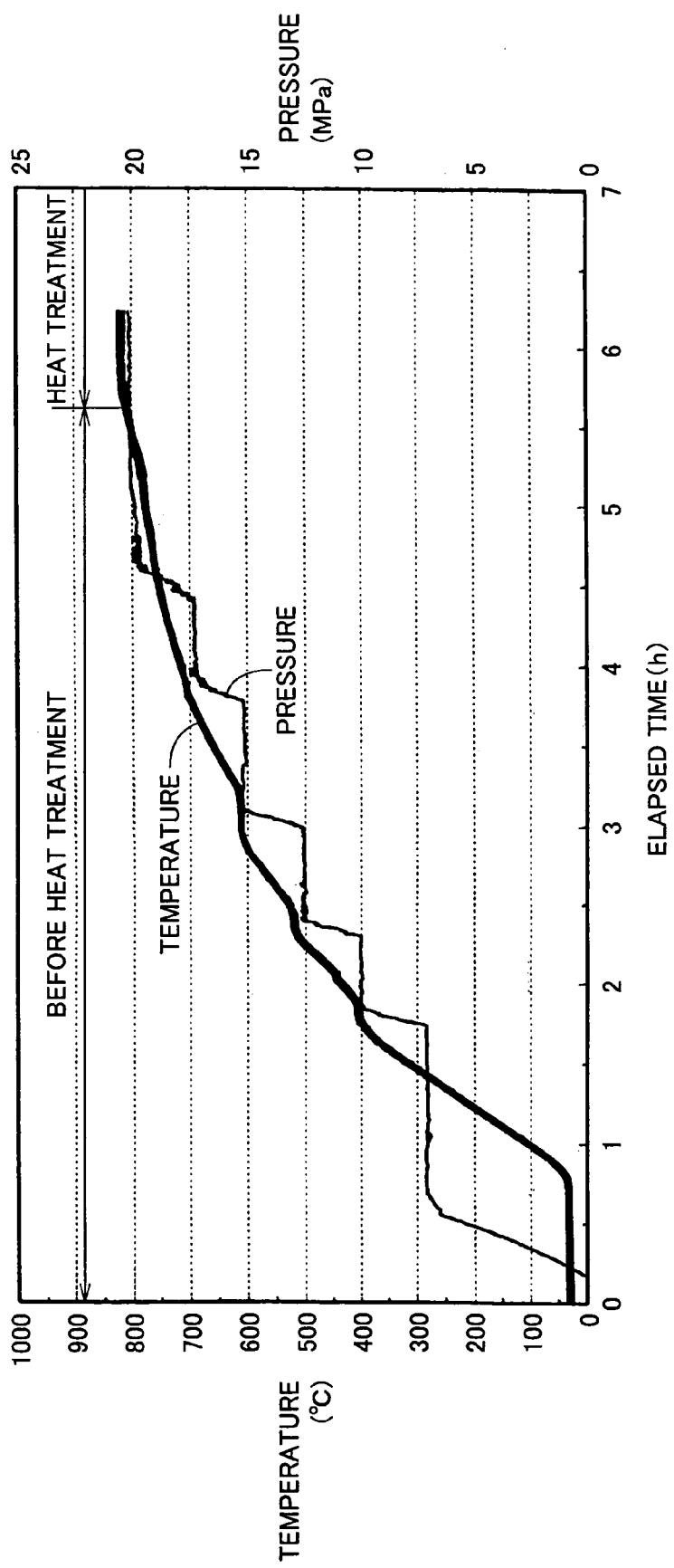
FIG. 14 is a diagram showing the relation between temperatures and pressures in a heat treatment and time in a fourth method according to the second embodiment.

Referring to FIG. 14, a heat treatment is performed under conditions of a heat treatment temperature of 800° C. and a pressure of 20 MPa. At this time, the pressure is controlled to increase stepwise following temperature rise. In other words, the pressure is controlled to repeat a process of holding a prescribed pressure for a constant time, thereafter increasing the pressure and holding the increased pressure for a constant time again in pressure increase. More specifically, the pressure is held at about 7 MPa, about 10 MPa, about 12.5 MPa, about 15 MPa and about 17 MPa for constant times in the pressure increase process. The timing for increasing the pressure after holding the same for a constant time is controlled on the basis of a measured value of the temperature in the atmosphere. In other words, the pressure is controlled by increasing the pressure to about 7 MPa at the room temperature, increasing the pressure to about 10 MPa when the temperature reaches about 400° C., increasing the pressure to 12.5 MPa when the temperature reaches 500° C., increasing the pressure to about 15 MPa when the temperature reaches 600° C. and increasing the pressure to about 17 MPa when the temperature reaches 700° C. In order to form a stable oxide superconducting phase, the partial oxygen pressure is controlled to be regularly in the range of 0.003 to 0.008 MPa.

In a wire having pinholes, pressurizing gas penetrates into the wire through the pinholes also when a step of performing a heat treatment in a pressurized atmosphere is carried out by ordinary pressing, and hence pressure difference between the internal and external pressures of the wire disappears to result in a small effect of preventing reduction of the critical current density resulting from voids and blisters by pressing. When the pressure is controlled to increase stepwise following temperature rise as in the fourth technique, however, the external pressure increases before the pressing gas penetrates into the wire through pinholes. Thus, pressure difference is caused between the internal and external pressures of the wire so that formation of voids and blisters is suppressed and reduction of the critical current density is effectively prevented regardless of whether or not the wire has pinholes before the heat-treating step.

Formation of voids and blisters in the wire can be further effectively suppressed by combining the following technique with the aforementioned first to fourth techniques. This technique is now described.

In this technique, the decompression speed of the total pressure in the pressurized atmosphere is controlled to be less than a constant speed in at least either the first heat treatment (step S4) or the second heat treatment (step S6) shown in FIG. 2 if the temperature in the atmosphere is at least 200° C. in the heat-treating step.

Referring to FIGS. 15A to 15D, the pressure is controlled to increase stepwise following temperature rise in the atmosphere at a heat-up time before the heat treatment, similarly to the aforementioned fourth technique. While it seems that no prescribed pressure is held for a constant time in FIG. 15B, a pressure holding part merely seems to be omitted since the scale of an elapsed time in FIG. 15B is excessively larger than that in FIG. 14, and the prescribed pressure is held for a constant time in practice similarly to the case of FIG. 14. The temperature and the pressure are set to 815° C. and 20 MPa respectively due to this heat-up step, and a heat treatment of 50 hours is performed in this state. At the heat-up time before the heat treatment and in the heat treatment, the decompression speed for the total pressure in the pressurized atmosphere is controlled to not more than 0.05 MPa/min. when the temperature in the atmosphere is at least 200° C. After the heat treatment, the temperature is reduced at a speed of 50° C./h. Also after the heat treatment, the decompression speed for the total pressure in the pressurized atmosphere is controlled to not more than 0.05 MPa/min. when the temperature in the atmosphere is at least 200° C. If the temperature reduction speed after the heat treatment is 50° C./h, the natural decompression speed following temperature reduction is regularly not more than 0.05 MPa/min., and hence the decompression speed may not be controlled. Further, the oxygen concentration is kept at 0.04% before the heat treatment, in the heat treatment and after the heat treatment. Thus, the partial oxygen pressure is regularly in the range of 0.003 to 0.008 MPa, so that a stable oxide superconducting phase is formable.

If the heating vessel is abruptly decompressed when the temperature in the atmosphere is at least 200° C., the pressure in the wire increases as compared with that outside the wire, to blister the wire. Therefore, the decompression speed for the total pressure in the pressurized atmosphere is controlled to be less than a constant speed, so that the effect of inhibiting the wire from formation of blisters resulting from abrupt decompression during the heat treatment (before the heat treatment, in the heat treatment and after the heat treatment) is further remarkable.

As to a wire having a silver ratio of 3.0, the decompression speed is controlled to not more than 0.03 MPa/min. when the temperature in the atmosphere is a least 200° C.

The fifth technique is now described. In the fifth technique, the total pressure of the atmosphere is controlled to continuously increase at a speed of at least 0.05 MPa/min. at the heat-up time before the heat treatment in either the first heat treatment (step S4) or the second heat treatment (step S6). In the heat treatment, the total pressure in the atmosphere is controlled to continuously increase. In temperature reduction immediately after the heat treatment, further, control is made to compensate for reduction of the pressure resulting from temperature reduction (to add a pressure).

Referring to FIG. 16, the pressure is loosely increased according to the state equation of gas at the heat-up time before the heat treatment if the temperature of the atmosphere is not more than 700° C., for example. When the temperature of the atmosphere substantially exceeds 700° C., the pressure in the atmosphere is increased to about 10 MPa. At this time, the pressure in the atmosphere is increased at a blast with a pressing speed of at least 0.05 MPa/min.

The inventors have found that the speed of pressurizing gas penetrating into a wire through pinholes is less than about 0.05 MPa/min. when an oxide superconducting wire having the pinholes is heat-treated in a pressurized atmosphere. Therefore, the pressure in the atmosphere can be kept higher than that in the wire at the heat-up time before the heat treatment by controlling the total pressure of the atmosphere to continuously increase at a speed of at least 0.05 MPa/min. at the heat-up time before the heat treatment.

Thereafter the temperature is kept at 830° C., for example, in the heat treatment. On the other hand, the pressure in the atmosphere is continuously increased. While the pressing speed in the heat treatment is preferably as high as possible, the total pressure exceeds 50 MPa if the pressing speed is excessively high and hence the pressure must be continuously increased at such a proper pressing speed that the total pressure in the heat treatment does not exceed 50 MPa. Referring to FIG. 16, the pressure is increased to about 30 MPa. Therefore, the time when the pressure in the wire and that in the atmosphere are equalized with each other can be retarded from a time t1 to a time t2 as compared with a case where the pressure is kept constant in the heat treatment. Thus, the state where the pressure in the atmosphere is higher than that in the wire can be continuously kept longer in the heat treatment.

Thereafter in temperature reduction immediately after the heat treatment, the pressure starts to lower according to the state equation of gas following reduction of the temperature in the atmosphere. At this time, the pressure is controlled to compensate for reduction of the pressure resulting from temperature reduction (to add a pressure). In order to form a stable oxide superconducting phase, the partial oxygen pressure is controlled to be regularly in the range of 0.003 to 0.02 MPa.

According to the fifth technique, the pressure in the atmosphere increases beyond that in the wire at the heat-up time before the heat treatment, whereby compressive force can be applied to the wire. Further, the state where the pressure in the atmosphere is higher than that in the wire can be continuously kept longer in the heat treatment. Consequently, formation of voids and blisters is suppressed at the heat-up time before the heat treatment and in the heat treatment, whereby reduction of the critical current density can be effectively suppressed due to the heat treatment in the pressurized atmosphere of at least 1 MPa and less than 50 MPa.

Third Embodiment

In order to further improve the critical current density of the oxide superconducting wire, the inventors have made deep studies as to the optimum partial oxygen pressure at the heat-up time before the heat treatment and in the heat treatment. Thus, results shown in FIG. 17 have been obtained.

Referring to FIG. 17, it is understood that a stable oxide superconducting phase is formed and the critical current density is improved in a temperature range of at least 815° C. and not more than 825° C. if the partial oxygen pressure is 0.007 MPa, for example. Further, a stable oxide superconducting phase is formed and the critical current density is improved in a temperature range of at least 750° C. and not more than 800° C., preferably in a temperature range of at least at least 770° C. and no more than 800° C. if the partial oxygen pressure is 0.0003 MPa, although this is not shown in the figure. In addition, a stable oxide superconducting phase is formed and the critical current density is improved in a set in the optimum partial oxygen pressure range regardless of temperature fluctuation, whereby a stable oxide superconducting phase is formed so that the critical current density can be improved.

From the above relation between the temperature and the partial oxygen pressure, the value of the partial oxygen pressure optimum for forming an oxide superconducting phase increases following temperature rise. At the heat-up time before the heat treatment, therefore, the partial oxygen pressure can be set in the range optimum for forming an oxide superconducting phase by controlling the partial oxygen pressure to increase following temperature rise in the atmosphere. Thus, a stable oxide superconducting phase is formed so that the critical current density can be improved When a wire is held at a constant temperature in the heat treatment, fluctuation (error) of several ° C. is frequently caused in the temperature. Considering the relation between this fluctuation of the temperature and the optimum range of the partial oxygen pressure, the optimum partial oxygen pressure is at least 0.006 MPa and not more than 0.01 MPa when the wire is held at 822.5° C., for example, while the optimum partial oxygen pressure is at least 0.007 MPa and not more than 0.011 MPa when the temperature fluctuates to 825° C. When the temperature fluctuates to 820° C., the optimum partial oxygen pressure is at least 0.005 MPa and not more than 0.009 MPa. In order to regularly attain the optimum partial oxygen pressure despite such temperature fluctuation, therefore, it follows that the partial oxygen pressure may be controlled to be constant in a fluctuation range (slant line portion in FIG. 17) of at least 0.007 MPa and not more than 0.009 MPa when the wire is held at 822.5° C.

This fluctuation range of the partial oxygen pressure is about 10% of the value of the partial oxygen pressure. When the partial oxygen pressure in the heat treatment is controlled to be constant in the fluctuation range within 10%, therefore, the partial oxygen pressure can be set in the optimum partial oxygen pressure range regardless of temperature fluctuation, whereby a stable oxide superconducting phase is formed so that the critical current density can be improved.

Fourth Embodiment

In order to further improve the critical current density of the oxide superconducting wire, the inventors have controlled the decompression speed for the total pressure in the heat treatment to 0.05 MPa/min. and made deep studies as to the relation between the value of the total pressure and formation of blisters in the wire.

Raw material powder containing Bi, Pb, Sr, Ca and Cu in composition ratios of 1.82:0.33:1.92:2.01:3.02 was prepared. This raw material powder was heat-treated at 750° C. for 10 hours, and thereafter heat-treated at 800° C. for 8 hours. Thereafter powder obtained by pulverization was heat-treated at 850° C. for 4 hours, and thereafter pulverized again. Powder obtained by the pulverization was heat-treated under decompression, and thereafter charged into a metal tube of silver having an outer diameter of 36 mm and an inner diameter of 31 mm. Then, the metal tube charged with the powder was wiredrawn. Further, 61 wiredrawn wires were bundled and engaged into a metal tube of 36 mm in outer diameter and 31 mm in inner diameter. Then, wiredrawing and primary rolling were performed for obtaining a tapelike superconducting wire having a Bi2223 phase with a thickness of 0.25 mm and a width of 3.6 mm. Then, a first heat treatment was performed on this wire. The first heat treatment was performed in the atmosphere with a heat treatment temperature set to 842° C. and a heat treatment time set to 50 hours. Then, secondary rolling was performed, followed by a second heat treatment. The second heat treatment was performed by setting the partial oxygen pressure to 0.008 MPa, setting the heat treatment temperature to 825° C., setting the heat treatment time to 50 hours, controlling the decompression speed for the total pressure in the heat treatment to 0.05 MPa/min. and varying the total pressure as shown in Table 1. After the second heat treatment, presence/absence of blisters in the wire was investigated. Table 1 also shows the total pressure and presence/absence of blisters in the wire.

TABLE 1

| Total Pressure (MPa) | Expansion of Wire |
| --- | --- |
| 0.1 | no |
| 0.2 | no |
| 0.3 | no |
| 0.4 | no |
| 0.5 | no |
| 0.8 | no |
| 1.0 | yes |
| 2.0 | yes |
| 3.0 | yes |
| 5.0 | yes |
| 10.0 | yes |
| 20.0 | yes |
| 30.0 | yes |

From the results shown in Table 1, the wire is blistered when the total pressure is at least 1 MPa. Thus, it is necessary to control the decompression speed in the pressurize atmosphere to not more than 0.05 MPa/min. when the total pressure is at least 1 MPa, in order to inhibit the wire from blisters.

Then, the heat treatment temperature for the second heat treatment was set to 500° C., for similarly investigating presence/absence of blisters in the wire. Table 2 also shows the total pressure and presence/absence of blisters of the wire.

TABLE 2

| Total Pressure (MPa) | Expansion of Wire |
| --- | --- |
| 0.1 | no |
| 0.2 | no |

TABLE 2-continued

| Total Pressure (MPa) | Expansion of Wire |
| --- | --- |
| 0.3 | no |
| 0.4 | no |
| 0.5 | no |
| 0.8 | no |
| 1.0 | yes |
| 2.0 | yes |
| 3.0 | yes |
| 5.0 | yes |
| 10.0 | yes |
| 20.0 | yes |
| 30.0 | yes |

From the results shown in Table 2, the wire is blistered if the total pressure is at least 1 MPa also when the heat treatment temperature is 500° C. Thus, it is necessary to control the decompression speed in the pressurize atmosphere to not more than 0.05 MPa/min. if the total pressure is at least 1 MPa, in order to inhibit the wire from blisters also when the heat treatment temperature is 500° C.

Fifth Embodiment

Referring to FIG. 18, voids large in the longitudinal direction (transverse direction in FIG. 18) substantially disappear while voids 20 extending perpendicularly to the longitudinal direction slightly remain in a superconducting filament 2 of an oxide superconducting wire 1 subjected to a heat treatment in a pressurized atmosphere having a total pressure of at least 1 MPa and less than 50 MPa. FIG. 18 shows a single-core oxide superconducting wire having a single superconducting filament.

In other words, the inventors have found that the number of the voids 20 extending perpendicularly to the longitudinal direction of the oxide superconducting wire 1 is hardly reduced by a heat treatment in a pressurized atmosphere either. This is conceivably for the following reason: In the pressurized atmosphere, a pressure is equally applied to all surfaces of the oxide superconducting wire. Oxide superconducting crystals cause creep deformation due to this pressure, and voids present on junction interfaces between the crystals shrink. Thus, the number of voids formed between the oxide superconducting crystals is reduced. However, the oxide superconducting wire 1 extends in the longitudinal direction, and hence force is hardly transmitted in the longitudinal direction and the wire 1 is hardly compressed in the longitudinal direction. Consequently, the number of the voids 20 extending perpendicularly to the longitudinal direction of the oxide superconducting wire 1 is hardly reduced even by the heat treatment in the pressurized atmosphere.

The voids 20 extending perpendicularly to the longitudinal direction of the oxide superconducting wire 1, blocking a current in the superconducting filament, cause reduction of the critical current density of the oxide superconducting wire 1. When suppressing formation of these voids 20, therefore, the critical current density of the oxide superconducting wire 1 can be further improved.

In this regard, the inventors have found that formation of the voids extending perpendicularly to the longitudinal direction of the oxide superconductor can be suppressed before the heat treatment thereby improving the critical current density of the oxide superconducting wire as a result by setting the draft for the oxide superconducting wire to not more than 84%, preferably not more than 80% in the primary rolling (step S5) in FIG. 2. The reason for this is now described.

The primary rolling is a step carried out for increasing the density of the raw material powder charged into the metal tube. As the draft for the oxide superconducting wire is increased (the reduction ratio is increased), the density of the raw material powder charged into the metal tube increases. When the density of the raw material powder increases, the density of superconducting crystals formed by the subsequent heat treatments (steps S4 and S5) increases to improve the critical current density of the oxide superconducting wire.

When the draft for the oxide superconducting wire is increased in the primary rolling, on the other hand, the following three phenomena resulting from. the increased reduction ratio may be recognized: First, voids (cracks) are formed in the raw material powder. Second, such sausaging that the shape of the filament in the oxide superconducting wire is rendered longitudinally heterogeneous is readily caused. Third, such bridging that the superconducting filament comes into contact with another superconducting filament on a portion where the sectional area thereof locally increases is readily caused due to the sausaging. All these phenomena may reduce the critical current density of the oxide superconducting wire.

Therefore, the primary rolling must be performed with such a draft that the density of the raw material powder increases and no voids are formed in the raw material powder. In conventional primary rolling, an oxide superconducting wire has been rolled with a draft of about 86 to 90%.

When the heat treatment is performed in the pressurized atmosphere of at least 1 MPa and less than 50 MPa, however, an effect of compressing the oxide superconducting wire is obtained also in the heat treatment. Also when the primary rolling is performed with a draft of not more than 84%, therefore, the raw material powder is compressed in the subsequent heat treatment in the pressurized atmosphere and hence the density of the superconducting filament of the oxide superconducting wire can be increased as a result. On the other hand, voids are hardly formed in the raw material powder due to the primary rolling performed with the draft of not more than 84%, whereby formation of voids extending perpendicularly to the longitudinal direction of the oxide superconducting wire can be suppressed. Further, completely no voids are formed in the raw material powder due to the primary rolling performed with the draft of not more than 80%. The critical current density of the oxide superconducting wire can be improved for the aforementioned reasons.

Referring to FIG. 19, the critical current density of the oxide superconducting wire most increases when the primary rolling is performed with a draft of about 86% if the heat treatment is performed in the atmosphere. If the heat treatment is performed in the pressurized atmosphere according to the present invention, on the other hand, the critical current density of the oxide superconducting wire most increases when the primary rolling is performed with a draft of about 82%. Thus, it is understood that the optimum draft for the primary rolling for improving the critical current density of the oxide superconducting wire shifts to a lower draft side when the heat treatment is performed in the pressurized atmosphere of at least 1 MPa and less than 50 MPa.

In order to confirm the aforementioned effect, the inventors have prepared oxide superconducting wires in this embodiment under the following conditions, for measuring the critical current densities.

Raw material powder was charged into metal tubes on the basis of the step of manufacturing an oxide superconducting wire shown in FIG. 2, for performing wiredrawing. Then, primary rolling was performed for obtaining tapelike superconducting wires. The primary rolling was performed with two types of drafts of 82% and 87%. Further, rolls of 100 mm in diameter were employed for the primary rolling along with lubricating oil having kinetic viscosity of 10 $mm^2/s$. Then, a first heat treatment was performed on these wires. The first heat treatment was performed by setting the partial oxygen pressure to 0.008 MPa, setting the heat treatment temperature to 830° C. and setting the heat treatment time to 30 hours. Then, secondary rolling was performed. The secondary rolling was performed with a draft of 5 to 30% with rolls of 300 mm in diameter without lubricating oil. Then, a second heat treatment was performed. The second heat treatment was performed by setting the partial oxygen pressure to 0.008 MPa, setting the heat treatment temperature to 820° C. and setting the heat treatment time to 50 hours. After the second heat treatment, the critical current densities of the obtained oxide superconducting wires were measured.

Consequently, the critical current density was 30 $kA/cm^2$ in the oxide superconducting wire worked with the draft of 87% in the primary rolling. On the other hand, the critical current density was 40 $kA/cm^2$ in the oxide superconducting wire worked with the draft of 82%. From the aforementioned results, it is understood possible to suppress formation of voids extending perpendicularly to the longitudinal direction of the oxide superconducting wire before the heat treatment thereby improving the critical current density of the oxide superconducting wire by setting the draft for the oxide superconducting wire to not more than 84% in the primary rolling (step S5).

While each of the above embodiments is described with reference to a method of manufacturing an oxide superconducting wire having a Bi2223 phase by hot isostatic pressing, it is also possible to carry out the present invention by pressing other than hot isostatic pressing so far as the method performs a heat treatment in a pressurized atmosphere of at least 1 MPa and less than 50 MPa. Further, the present invention is also applicable to a method of manufacturing an oxide superconducting wire having another composition such as a yttrium-based composition other than the bismuth-based composition.

While the step of plating the wire with silver or a silver is carried out in the second embodiment of the present invention, it is also possible to carry out the present invention with a sputtering step, for example, so far as the step is employed for bonding silver or a silver alloy to the wire. While FIG. 14 and FIGS. 15A to 15D show specific control conditions for the temperature, the pressure, the oxygen concentration and the partial oxygen pressure, in addition, the present invention is not restricted to these conditions but the decompression speed for the total pressure in the pressurized atmosphere may be controlled to not more than 0.05 MPa/min. when the pressure is controlled to increase stepwise following temperature rise and the temperature in the atmosphere is at least 200° C.

When the first to fifth techniques in the second embodiment of the present invention are combined with the heat treatment conditions in the first embodiment, formation of pinholes can be prevented, or formation of voids and blisters in the wire can be effectively suppressed also when pinholes are formed.

Further, formation of voids and blisters in the wire can be more effectively suppressed by properly combining the first to fifth techniques in the second embodiment of the present invention.

While control is made to compensate for reduction of the pressure resulting from temperature reduction (to add a pressure) in temperature reduction immediately after the heat treatment in the fifth technique according to the second embodiment of the present invention, the present invention is not restricted to this case but the pressure in the atmosphere may be controlled to continuously increase at least in the heat treatment.

While the exemplary optimum numerical range of the partial oxygen pressure at the heat-up time before the heat treatment and in the heat treatment is shown in the third embodiment of the present invention, the present invention is not restricted to the case of controlling the partial oxygen pressure with this numerical range but the partial oxygen pressure may be controlled to increase following temperature rise in the atmosphere.

While exemplary kinetic viscosity of the lubricating oil in rolling and an exemplary diameter of the rolls employed for rolling are shown in the fifth embodiment, the present invention is not restricted to such rolling conditions but the draft for the wire in the rolling step may be not more than 84%.

The embodiments disclosed above are considered to be illustrative in all points and not restrictive. The scope of the present invention is shown not by the aforementioned embodiments but by the scope of claim for patent, and intended to include all corrections and modifications within the meaning and range equivalent to the scope of claim for patent.

INDUSTRIAL APPLICABILITY

As hereinabove described, the inventive method of manufacturing an oxide superconducting wire is applicable to a method of manufacturing an oxide superconducting wire capable of preventing reduction of a critical current density.

What is claimed is:

1. A method of manufacturing an oxide superconducting wire, comprising:
    a step of preparing a wire formed by covering raw material powder of an oxide superconductor with a metal; and
    a step of heat-treating said wire in a pressurized atmosphere, wherein
    the total pressure of said pressurized atmosphere is at least 1 MPa and less than 50 MPa; and
    controlling the total pressure in the atmosphere to increase at a speed of at least 0.05 MPa/min at a heat-un time before the heat treatment in said heat-treating step.

2. The method of manufacturing an oxide superconducting wire according to claim 1, wherein
    said heat-treating step is carried out by hot isostatic pressing.

3. The method of manufacturing an oxide superconducting wire according to claim 1, wherein
    said oxide superconductor is a Bi—Pb—Sr—Ca—Cu—O oxide superconductor including a Bi2223 phase containing bismuth, lead, strontium, calcium and copper in atomic ratios of (bismuth and lead):strontium:calcium:copper approximately expressed as 2:2:2:3.

4. The method of manufacturing an oxide superconducting wire according to claim 1, wherein
    said heat-treating step is carried out in an oxygen atmosphere, with a partial oxygen pressure of at least 0.003 MPa and not more than 0.02 MPa.

5. The method of manufacturing an oxide superconducting wire according to claim 4, controlling said partial oxygen pressure to increase following temperature rise in said pressurized atmosphere at a heat-up time before the heat treatment in said heat-treating step.

6. The method of manufacturing an oxide superconducting wire according to claim 1, controlling the total pressure in said pressurized atmosphere to be constant in the heat treatment.

7. The method of manufacturing an oxide superconducting wire according to claim 1, wherein
    said heat-treating step is carried out in an oxygen atmosphere, while controlling the partial oxygen pressure in the heat treatment to be constant in a fluctuation range within 10%.

8. The method of manufacturing an oxide superconducting wire according to claim 1, injecting gas to compensate for reduction of the pressure resulting from temperature reduction in the temperature reduction immediately after the heat treatment.

9. The method of manufacturing an oxide superconducting wire according to claim 8, wherein
    said metal covering said raw material powder includes silver, the ratio of the area of said metal portion to the area of said oxide superconductor portion in a cross section of said wire after said heat-treating step is 1.5, and
    a decompression speed in the temperature reduction immediately after said heat treatment is not more than 0.05 MPa/min.

10. The method of manufacturing an oxide superconducting wire according to claim 9, wherein
    said metal covering said raw material powder includes silver, and the ratio of the area of said metal portion to the area of said oxide superconductor portion in the cross section of said wire after said heat-treating step is 1.5,
    for controlling the decompression speed for the total pressure in said pressurized atmosphere to be not more than 0.05 MPa/min. when the temperature in said pressurized atmosphere is at least 20° C. in said heat-treating step.

11. The method of manufacturing an oxide superconducting wire according to claim 8, wherein
    said metal covering said raw material powder includes silver, the ratio of the area of said metal portion to the area of said oxide superconductor portion in the cross section of said wire after said heat-treating step is 3.0, and
    a decompression speed in the temperature reduction immediately after said heat treatment is not more than 0.03 MPa/min.

12. The method of manufacturing an oxide superconducting wire according to claim 11, wherein
    said metal covering said raw material powder includes silver, and the ratio of the area of said metal portion to the area of said oxide superconductor portion in the cross section of said wire after said heat-treating step is 3.0,
    for controlling the decompression speed for the total pressure in said pressurized atmosphere to be not more than 0.03 MPa/min. when the temperature in said pressurized atmosphere is at least 20° C. in said heat-treating step.

13. The method of manufacturing an oxide superconducting wire according to claim 1, controlling the decompression speed for the total pressure in said pressurized atmosphere to be not more than 0.05 MPa/min. when the total pressure of said pressurized atmosphere is at least 1 MPa in said heat-treating step.

14. The method of manufacturing an oxide superconducting wire according to claim 1, further comprising a step of rolling said wire with a roll after said step of preparing said wire and before said heat-treating step, wherein the integumentary thickness of said wire after said rolling step is at least 20 µm.

15. The method of manufacturing an oxide superconducting wire according to claim 1, further comprising a step of bonding silver or a silver alloy to the surface of said wire after said step of preparing said wire and before said heat-treating step.

16. The method of manufacturing an oxide superconducting wire according to claim 1, further comprising a step of rolling said wire with a roll after said step of preparing said wire and before said heat-treating step, wherein
the maximum height Ry of irregularities is not more than 320 µm as to the surface roughness of a portion of said roll coming into contact with said wire.

17. The method of manufacturing an oxide superconducting wire according to claim 1, controlling the pressure to increase stepwise following temperature rise in the atmosphere at a heat-up time before the heat treatment in said heat-treating step.

18. The method of manufacturing an oxide superconducting wire according to claim 1, controlling the total pressure in said atmosphere to continuously increase in the heat treatment in said heat-treating step.

19. The method of manufacturing an oxide superconducting wire according to claim 1, further comprising a step of rolling said wire after said step of preparing said wire and before said heat-treating step, wherein the draft of said wire in said rolling step is not more than 84%.

20. The method of manufacturing an oxide superconducting wire according to claim 19, wherein
the draft of said wire in said rolling step is not more than 80%.

21. The method of manufacturing an oxide superconducting wire according to claim 1, wherein
a plurality of heat treatments are performed on said wire, and at least one heat treatment among said plurality of heat treatments is carried out in a pressurized atmosphere having a total pressure of at least 1 MPa and less than 50 MPa.

* * * * *